(12) United States Patent
Kang et al.

(10) Patent No.: US 11,251,313 B2
(45) Date of Patent: Feb. 15, 2022

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Seung Mo Kang, Suwon-si (KR); Moon Seung Yang, Suwon-si (KR); Jongryeol Yoo, Suwon-si (KR); Sihyung Lee, Suwon-si (KR); Sunguk Jang, Suwon-si (KR); Eunhye Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 79 days.

(21) Appl. No.: 16/774,653

(22) Filed: Jan. 28, 2020

(65) Prior Publication Data
US 2020/0381564 A1 Dec. 3, 2020

(30) Foreign Application Priority Data
May 28, 2019 (KR) .......................... 10-2019-0062553

(51) Int. Cl.
*H01L 29/786* (2006.01)
*H01L 29/423* (2006.01)
(Continued)

(52) U.S. Cl.
CPC ...... *H01L 29/78696* (2013.01); *H01L 21/311* (2013.01); *H01L 21/823418* (2013.01);
(Continued)

(58) Field of Classification Search
CPC ............ H01L 29/0847; H01L 29/42392; H01L 29/78696; H01L 29/0869; H01L 29/0886
See application file for complete search history.

(56) References Cited

U.S. PATENT DOCUMENTS 6,261,911 B1 7/2001 Lee et al.
7,190,035 B2 3/2007 Ito
(Continued)

FOREIGN PATENT DOCUMENTS

KR 10-0301249 B1 11/2001
KR 10-0578218 B1 5/2006
(Continued)

*Primary Examiner* — Victoria K. Hall
(74) *Attorney, Agent, or Firm* — Lee IP Law, PC

(57) ABSTRACT

A semiconductor device includes a channel pattern including first and second semiconductor patterns stacked on a substrate, a gate electrode covering top and lateral surfaces of the channel pattern and extending in a first direction, and including a first gate segment between the first semiconductor pattern and the second semiconductor pattern, a gate spacer covering a lateral surface of the gate electrode and including an opening exposing the channel pattern, and a first source/drain pattern on a side of the gate spacer and in contact with the channel pattern through the opening, the first source/drain pattern including a sidewall center thickness at a height of the first gate segment and at a center of the opening, and a sidewall edge thickness at the height of the first gate segment and at an edge of the opening, the sidewall edge thickness being about 0.7 to 1 times the sidewall center thickness.

19 Claims, 29 Drawing Sheets

(51) Int. Cl.
  *H01L 29/08*     (2006.01)
  *H01L 29/06*     (2006.01)
  *H01L 29/66*     (2006.01)
  *H01L 29/78*     (2006.01)
  *H01L 27/088*    (2006.01)
  *H01L 21/8234*   (2006.01)
  *H01L 21/311*    (2006.01)

(52) U.S. Cl.
  CPC .......... *H01L 21/823437* (2013.01); *H01L 21/823468* (2013.01); *H01L 27/0886* (2013.01); *H01L 29/0673* (2013.01); *H01L 29/0847* (2013.01); *H01L 29/42392* (2013.01); *H01L 29/66545* (2013.01); *H01L 29/66575* (2013.01); *H01L 29/785* (2013.01); *H01L 29/7848* (2013.01)

(56) References Cited

U.S. PATENT DOCUMENTS

| | | | |
|---|---|---|---|
| 7,402,483 | B2 | 7/2008 | Yun et al. |
| 8,723,266 | B2 | 5/2014 | Tsai et al. |
| 9,012,310 | B2 | 4/2015 | Tsai et al. |
| 9,608,116 | B2 | 3/2017 | Ching et al. |
| 10,170,638 | B1 * | 1/2019 | Reznicek ............. H01L 29/775 |
| 10,256,158 | B1 * | 4/2019 | Frougier ......... H01L 21/823807 |
| 11,031,502 | B2 * | 6/2021 | Jang ................. H01L 29/7851 |
| 11,038,043 | B2 * | 6/2021 | Cheng ................ H01L 29/165 |
| 11,038,044 | B2 * | 6/2021 | Cheng ............. H01L 29/66795 |
| 2014/0084342 | A1 * | 3/2014 | Cappellani .......... H01L 29/401 257/192 |
| 2017/0148797 | A1 * | 5/2017 | Kim ................. H01L 27/1104 |
| 2017/0213911 | A1 * | 7/2017 | Balakrishnan ...... H01L 29/7848 |
| 2017/0221893 | A1 * | 8/2017 | Tak .................... H01L 29/0665 |
| 2017/0222006 | A1 * | 8/2017 | Suh ................... H01L 29/0847 |
| 2017/0222014 | A1 * | 8/2017 | Tak .................. H01L 21/76897 |
| 2017/0236900 | A1 * | 8/2017 | Chang ............... H01L 29/0847 257/347 |
| 2017/0256609 | A1 * | 9/2017 | Bhuwalka ............. H01L 29/775 |
| 2017/0345945 | A1 * | 11/2017 | Lee ..................... H01L 29/775 |
| 2018/0006159 | A1 * | 1/2018 | Guillorn ........... H01L 21/76889 |
| 2018/0090569 | A1 * | 3/2018 | Yang ................. H01L 29/1033 |
| 2018/0151732 | A1 * | 5/2018 | Mehandru ........... H01L 29/7848 |
| 2018/0151733 | A1 * | 5/2018 | Glass ................ H01L 29/42392 |
| 2018/0301531 | A1 * | 10/2018 | Xie ................... H01L 29/0673 |
| 2018/0315817 | A1 * | 11/2018 | Van Dal .......... H01L 21/823821 |
| 2018/0331232 | A1 * | 11/2018 | Frougier ........... H01L 29/42392 |
| 2019/0013405 | A1 | 1/2019 | Sung et al. |
| 2019/0058052 | A1 * | 2/2019 | Frougier ............. H01L 29/6653 |
| 2019/0067452 | A1 * | 2/2019 | Cheng ................ H01L 29/0653 |
| 2019/0067490 | A1 * | 2/2019 | Yang ................. H01L 29/66545 |
| 2019/0131274 | A1 * | 5/2019 | Wu ................... H01L 29/42376 |
| 2019/0148515 | A1 * | 5/2019 | Cheng ................ H01L 29/0847 257/347 |
| 2019/0165118 | A1 * | 5/2019 | Leobandung ....... H01L 29/0847 |
| 2019/0181225 | A1 * | 6/2019 | Lee ..................... H01L 29/0847 |
| 2019/0181241 | A1 * | 6/2019 | Tang .................... H01L 29/785 |
| 2019/0189769 | A1 * | 6/2019 | Basker .............. H01L 29/66553 |
| 2019/0237559 | A1 * | 8/2019 | Cheng .................... B82Y 10/00 |
| 2019/0326288 | A1 * | 10/2019 | Hashemi ................ B82Y 10/00 |
| 2019/0348498 | A1 * | 11/2019 | Cheng ................ H01L 29/78696 |
| 2020/0020691 | A1 * | 1/2020 | Choi ................ H01L 29/66795 |
| 2020/0044045 | A1 * | 2/2020 | Wang .................. H01L 29/1054 |
| 2020/0044060 | A1 * | 2/2020 | Cheng ................ H01L 29/0673 |
| 2020/0044061 | A1 * | 2/2020 | Cheng ............. H01L 29/66795 |
| 2020/0051981 | A1 * | 2/2020 | Yang ................. H01L 27/0924 |
| 2020/0091152 | A1 * | 3/2020 | Noh ................. H01L 21/823864 |
| 2020/0135932 | A1 * | 4/2020 | Wang ................... H01L 29/6653 |
| 2020/0168742 | A1 * | 5/2020 | Wang ................ H01L 21/02603 |
| 2020/0219976 | A1 * | 7/2020 | Kim ..................... H01L 29/785 |
| 2020/0220015 | A1 * | 7/2020 | Jang ................... H01L 29/0847 |
| 2020/0220018 | A1 * | 7/2020 | Jang ................. H01L 29/78696 |
| 2020/0303521 | A1 * | 9/2020 | Son ................... H01L 29/0847 |
| 2020/0365586 | A1 * | 11/2020 | Shin ................... H01L 27/0886 |
| 2020/0365692 | A1 * | 11/2020 | Jung ..................... H01L 29/785 |
| 2020/0381546 | A1 * | 12/2020 | Cho ................... H01L 29/0653 |
| 2020/0395446 | A1 * | 12/2020 | Yi ....................... H01L 29/0847 |
| 2020/0411641 | A1 * | 12/2020 | Noh ....................... B82Y 10/00 |
| 2021/0028297 | A1 * | 1/2021 | Yao ..................... H01L 29/775 |
| 2021/0082917 | A1 * | 3/2021 | Park ................... H01L 27/0924 |
| 2021/0083090 | A1 * | 3/2021 | Wang ................. H01L 21/02532 |
| 2021/0098625 | A1 * | 4/2021 | Tsai ................. H01L 21/823814 |
| 2021/0104616 | A1 * | 4/2021 | Su ...................... H01L 21/0262 |
| 2021/0118883 | A1 * | 4/2021 | Lim .................. H01L 29/66439 |
| 2021/0118991 | A1 * | 4/2021 | Ahn ................. H01L 21/823418 |

FOREIGN PATENT DOCUMENTS

| | | | | |
|---|---|---|---|---|
| WO | WO-2016204782 | A1 * | 12/2016 | ....... H01L 29/78696 |
| WO | WO-2016204786 | A1 * | 12/2016 | ....... H01L 29/78618 |
| WO | WO-2017111850 | A1 * | 6/2017 | ....... H01L 29/41725 |

* cited by examiner

SEMICONDUCTOR DEVICE AND METHOD OF FABRICATING THE SAME

CROSS-REFERENCE TO RELATED APPLICATION

Korean Patent Application No. 10-2019-0062553, filed on May 28, 2019, in the Korean Intellectual Property Office, and entitled: "Semiconductor Device and Method of Fabricating the Same," is incorporated by reference herein in its entirety.

BACKGROUND

1. Field

Embodiments relate to a semiconductor device and a method of fabricating the same.

2. Description of the Related Art

Semiconductor devices are beneficial in the electronic industry because of their small size, multi-functionality, and/or low fabrication cost. Semiconductor devices may encompass semiconductor memory devices storing logic data, semiconductor logic devices processing operations of logic data, and hybrid semiconductor devices having both memory and logic elements. Semiconductor devices have been expected to exhibit high integration with the advanced development of the electronic industry. For example, semiconductor devices have been increasingly expected to exhibit high reliability, high speed, and/or multi-functionality. Semiconductor devices have become more complicated and integrated to meet these requested characteristics.

SUMMARY

Embodiments are directed to a semiconductor device, including a channel pattern that includes a first semiconductor pattern and a second semiconductor pattern that are sequentially stacked on a substrate, a gate electrode that covers a top surface and a lateral surface of the channel pattern and extends in a first direction, the gate electrode including a first gate segment between the first semiconductor pattern and the second semiconductor pattern, a gate spacer that covers a lateral surface of the gate electrode and includes an opening through which the channel pattern is exposed, and a first source/drain pattern that is on a side of the gate spacer and is in contact with the channel pattern through the opening, the first source/drain pattern including a sidewall center thickness at a height of the first gate segment and at a center of the opening, and a sidewall edge thickness at the height of the first gate segment and at an edge of the opening, wherein the sidewall edge thickness is about 0.7 to 1 times the sidewall center thickness.

Embodiments are also directed to a semiconductor device, including an active pattern that protrudes from a substrate, a channel pattern that includes a first semiconductor pattern and a second semiconductor pattern that are sequentially stacked on the active pattern, a gate electrode that covers a top surface and a lateral surface of the channel pattern and extends in a first direction, the gate electrode including a first gate segment between the first semiconductor pattern and the second semiconductor pattern, a gate spacer that covers a lateral surface of the gate electrode and includes an opening through which the channel pattern is exposed, and a first source/drain pattern on a side of the gate spacer, the first source/drain pattern contacting the channel pattern through the opening and simultaneously contacting the active pattern, the first source/drain pattern including a first thickness at a lateral surface of the channel pattern, and a second thickness at a top surface of the active pattern, wherein the second thickness is greater than the first thickness.

Embodiments are also directed to a semiconductor device, including a channel pattern that includes a first semiconductor pattern and a second semiconductor pattern that are sequentially stacked on a substrate, a gate electrode that covers a top surface and a lateral surface of the channel pattern and extends in a first direction, the gate electrode including a first gate segment between the first semiconductor pattern and the second semiconductor pattern, a gate spacer that covers a lateral surface of the gate electrode and includes an opening through which the channel pattern is exposed, and a first source/drain pattern that is in contact with a lateral surface of the gate spacer and is spaced apart from the channel pattern, a portion of the first source/drain pattern being inserted into the opening.

Embodiments are also directed to a method of fabricating a semiconductor device, the method including forming a stack structure that includes a plurality of semiconductor patterns and a plurality of sacrificial patterns that are alternately stacked on a semiconductor substrate, forming a dummy gate electrode that runs across the stack structure and a gate spacer that covers a sidewall of the dummy gate electrode, wherein a portion of the stack structure is exposed outside the gate spacer, removing the portion of the stack structure exposed outside the gate spacer to form a spacer opening that exposes the stack structure below the dummy gate electrode, and forming a first source/drain pattern that covers a lateral surface of the stack structure exposed to the spacer opening, forming the first source/drain pattern including performing a selective epitaxial growth process to form the first source/drain pattern having a first sidewall profile, and performing a reflow process to change the first sidewall profile of the first source/drain pattern into a second sidewall profile.

BRIEF DESCRIPTION OF THE DRAWINGS

Features will become apparent to those of skill in the art by describing in detail example embodiments with reference to the attached drawings in which:

FIGS. 7A to 13A illustrate perspective views showing stages in a method of fabricating a semiconductor device of FIG. 2.

FIGS. 7B to 13B illustrate cross-sectional views showing stages in a method of fabricating a semiconductor device of FIG. 3.

FIGS. 7C to 13C illustrate plan views taken along line D-D' of FIGS. 7B to 13B, respectively.

DETAILED DESCRIPTION

Example embodiments will now be described more fully hereinafter with reference to the accompanying drawings.

Figure 1:
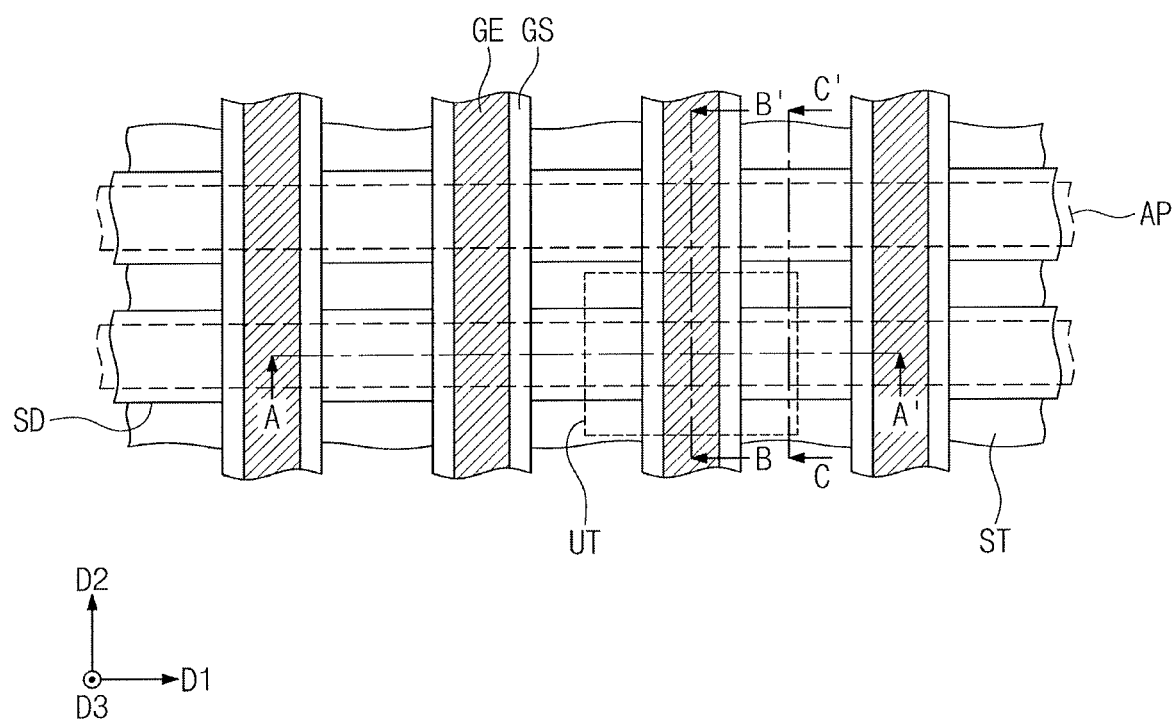
FIG. 1 illustrates a plan view showing a semiconductor device according to an example embodiment.
Figure 2:
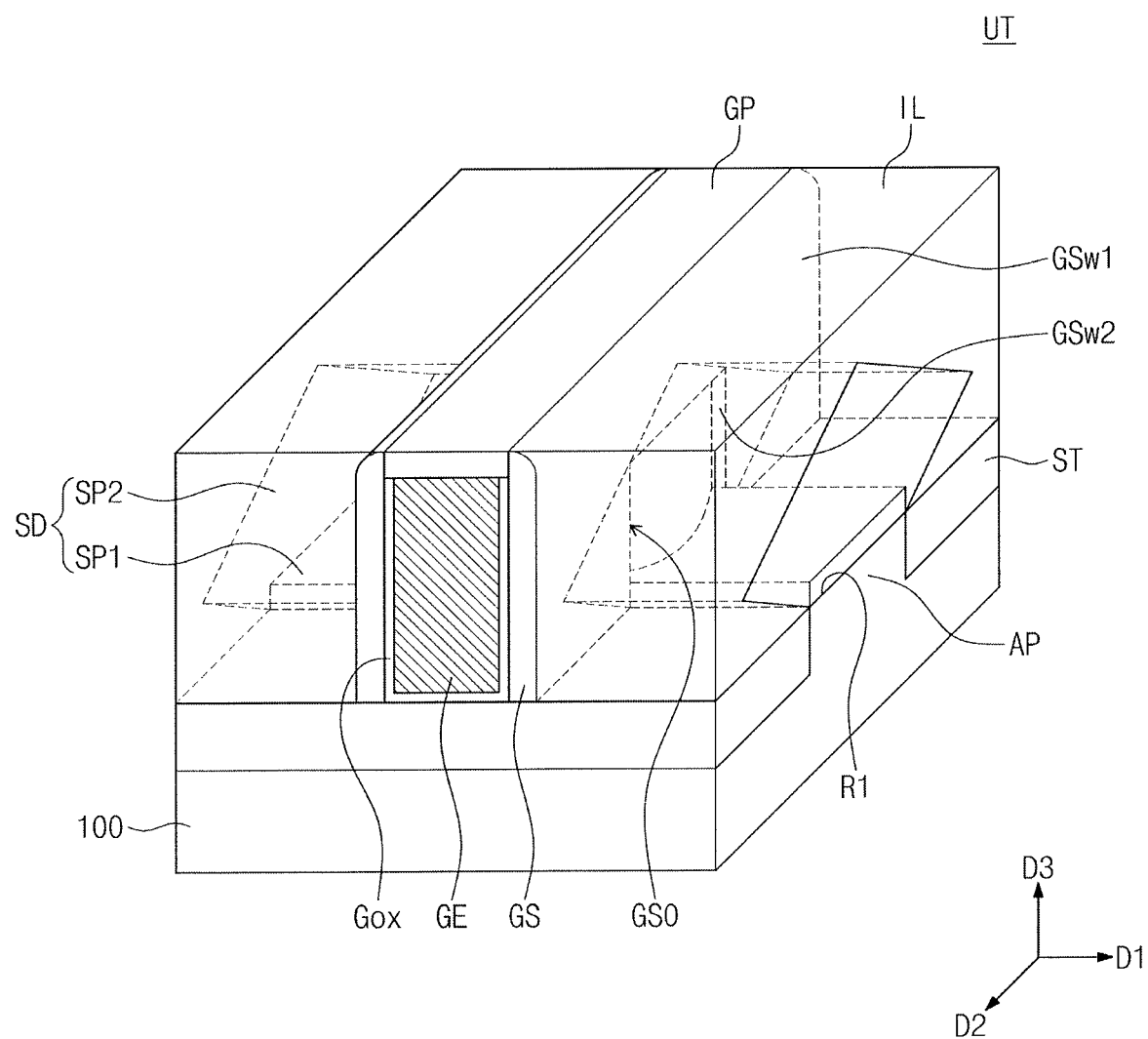
FIG. 2 illustrates a perspective view showing a unit transistor of FIG. 1.

FIG. 1 illustrates a plan view showing a semiconductor device according to an example embodiment. FIG. 2 illustrates a perspective view showing a unit transistor UT of FIG. 1.

Figure 3:
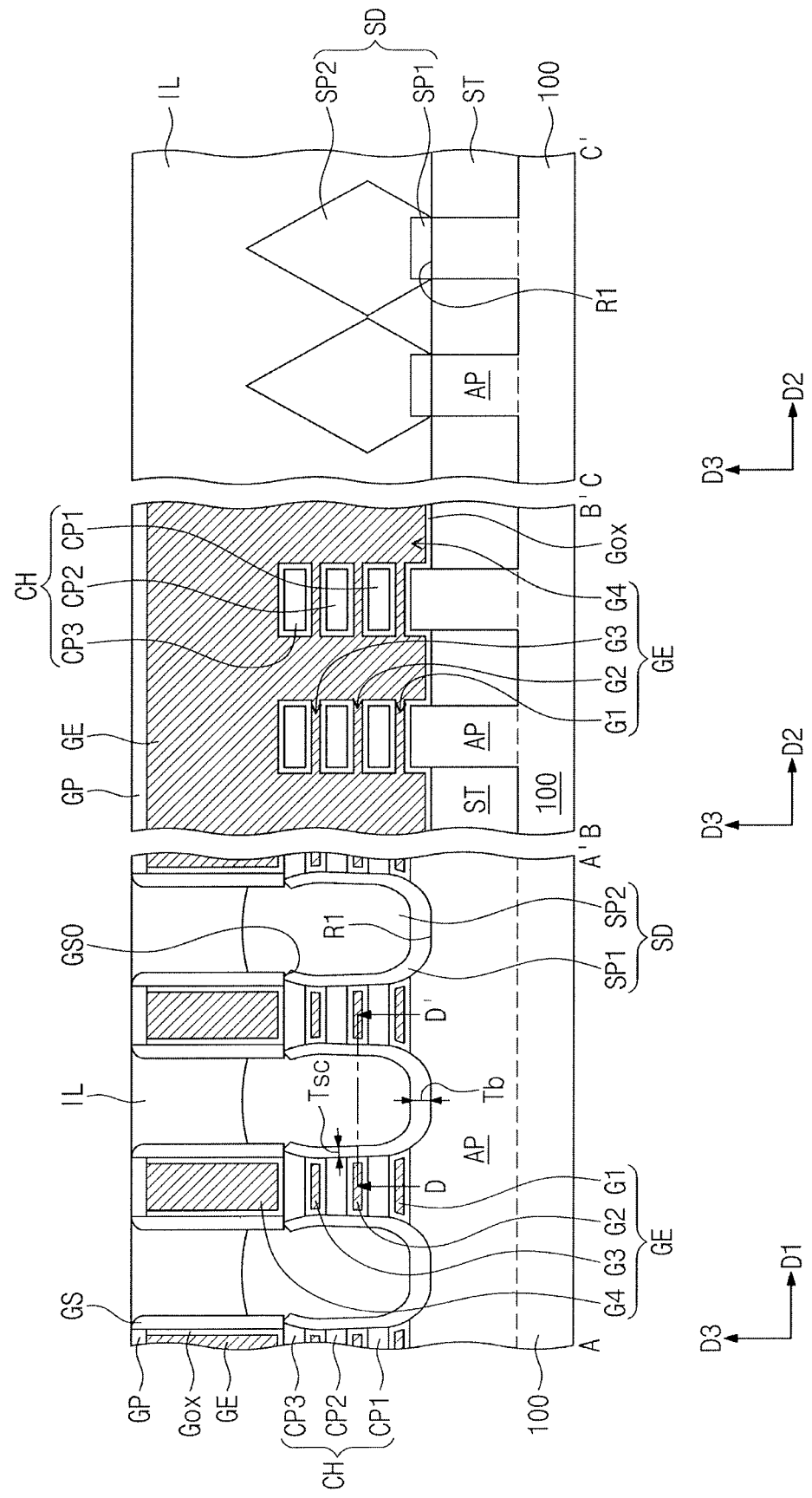
FIG. 3 illustrates cross-sectional views taken along lines A-A', B-B', and C-C' of FIG. 1.
Figure 4A:
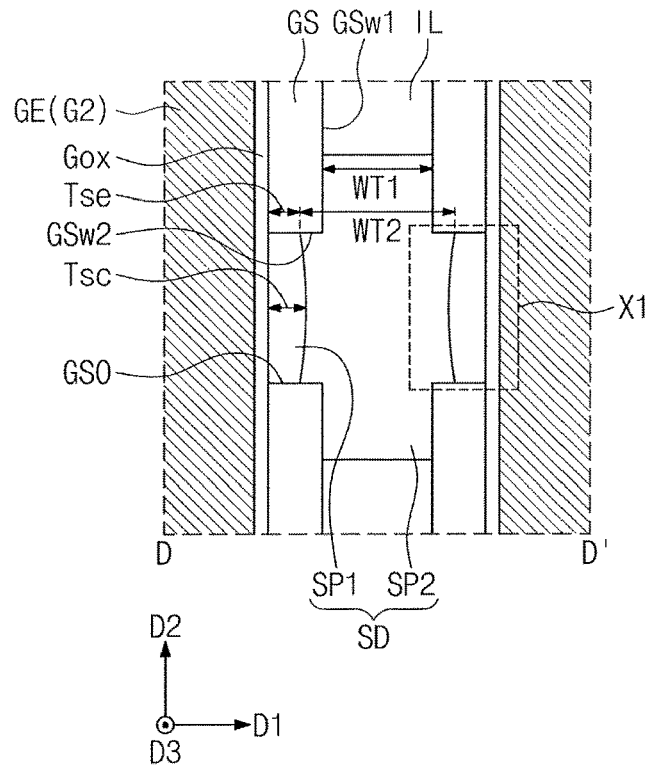
FIGS. 4A to 4C illustrate plan views taken along line D-D' of FIG. 3.
Figure 4B:
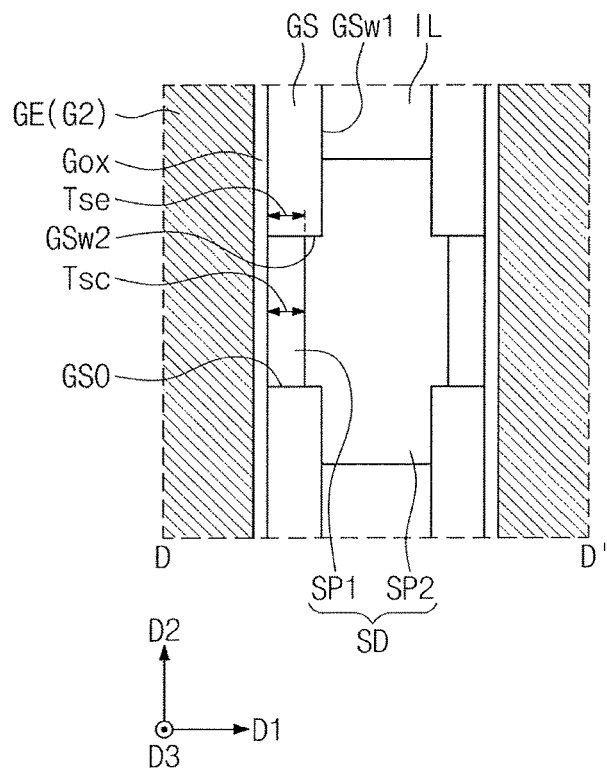
Figure 4C:
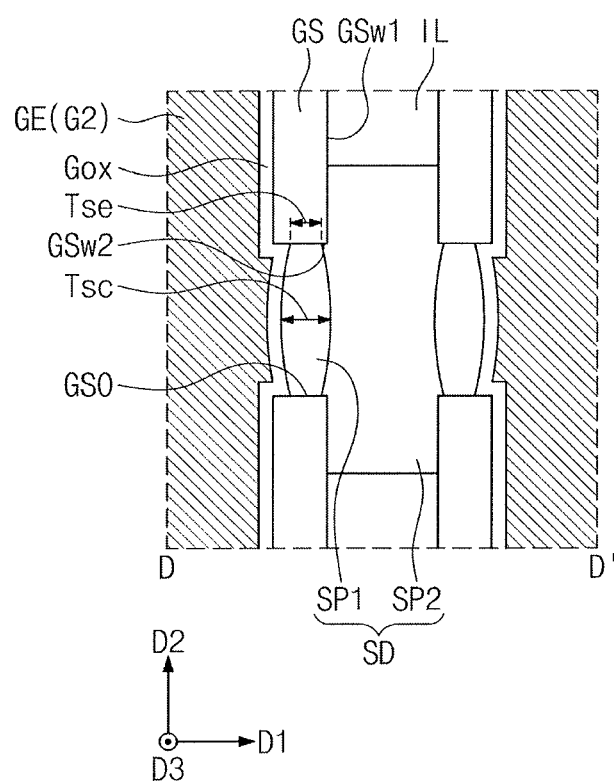

In detail, FIG. 1 illustrates a plan view showing a plurality of unit transistors UT that are arranged in a first direction D1 and a second direction D2, according to an example embodiment. FIG. 2 illustrates a perspective view showing one of the unit transistors UT. FIG. 3 illustrates cross-sectional views taken along lines A-A', B-B', and C-C' of FIG. 1, according to an example embodiment. FIGS. 4A to 4C illustrate plan views taken along line D-D' of FIG. 3, according to an example embodiment.

Referring to FIGS. 1 to 3, a substrate 100 is provided. The substrate 100 may be a single crystalline silicon substrate or a silicon-on-insulator (SOI) substrate. The substrate 100 may be a semiconductor substrate. Active patterns AP may protrude in a third direction D3 from the substrate 100. The active patterns AP may each have a bar or linear shape that is elongated in the first direction D1. The active patterns AP may be spaced apart from each other in the second direction D2 intersecting the first direction D1 and the third direction D3. A device isolation layer ST may be disposed on the substrate 100 on sides of the active patterns AP. The device isolation layer ST may be formed of a single or multiple layer including one or more of a silicon oxide layer, a silicon nitride layer, and a silicon oxynitride layer. As shown in FIG. 2, the device isolation layer ST may have a top surface at a height the same as or lower than that of top surfaces of the active patterns AP.

A plurality of gate electrodes GE may extend in the second direction D2 to cross the active patterns AP. The gate electrodes GE may be spaced apart from each other in the first direction D1.

The gate electrode GE may include a work function pattern and a metal line pattern. The work function pattern may be an N-type work function pattern or a P-type work function pattern. The N-type work function pattern may include one or more of lanthanum (La), lanthanum oxide (LaO), tantalum (Ta), tantalum nitride (TaN), niobium (Nb), and titanium nitride (TiN). The P-type work function pattern may include one or more of aluminum (Al), aluminum oxide (A1203), titanium nitride (TiN), tungsten nitride (WN), and ruthenium oxide ($RuO_2$). The metal line pattern may include one or more of tungsten, copper, and aluminum. The gate electrode GE may further include a diffusion break pattern between the work function pattern and the metal line pattern. The diffusion break pattern may include a metal nitride layer, such as one or more of a titanium nitride layer, a tantalum nitride layer, and a tungsten nitride layer.

A gate capping pattern GP may be disposed on the gate electrode GE. The gate capping pattern GP may be formed of, for example, a silicon nitride layer. A gate spacer GS may cover a sidewall of the gate electrode GE and a sidewall of the gate capping pattern GP. The gate spacer GS may have a single-layered or multi-layered structure formed of one or more of a silicon nitride layer, a silicon oxide layer, and a silicon oxynitride layer.

As shown in FIG. 3, a channel pattern CH may be disposed between the gate electrode GE and the active pattern AP. The channel pattern CH may include, for example, first, second, and third semiconductor patterns CP1, CP2, and CP3 that are stacked on the active pattern AP. The first, second, and third semiconductor patterns CP1, CP2, and CP3 may be spaced apart from each other in the third direction D3. The first, second, and third semiconductor patterns CP1, CP2, and CP3 may include silicon. The gate electrode GE may cover a top surface and a lateral surface of the channel pattern CH.

The gate electrode GE may include, for example, first, second, third, and fourth gate segments G1, G2, G3, and G4 that are integrally connected with each other and interleaved with the first, second, and third semiconductor patterns CP1, CP2, and CP3 in the third direction D3. The first gate segment G1 may be positioned between the active pattern AP and the first semiconductor pattern CP1. The second gate segment G2 may be positioned between the first semiconductor pattern CP1 and the second semiconductor pattern CP2. The third gate segment G3 may be positioned between the second semiconductor pattern CP2 and the third semiconductor pattern CP3.

A gate dielectric layer Gox may be interposed between the gate electrode GE and the channel pattern CH and between the gate electrode GE and the active pattern AP. The gate dielectric layer Gox may extend, for example, in the second and third directions D2, D3, to be interposed between the gate electrode GE and the gate spacer GS. The gate dielectric layer Gox may include one or more of a silicon oxide layer and a high-k dielectric layer whose dielectric constant is greater than that of a silicon oxide layer. The high-k dielectric layer may be formed of a material including, for example, one or more of hafnium oxide ($HfO_2$), hafnium silicate (HfSiO), hafnium oxynitride (HfON), hafnium silicon oxynitride (HfSiON), hafnium aluminum oxide ($HfAlO_3$), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), titanium oxide ($TiO_2$), barium strontium titanium oxide (BaSrTiO), barium titanium oxide (BaTiO), strontium titanium oxide (SrTiO), yttrium oxide (YO), aluminum oxide ($Al_2O_3$), tantalum oxide ($Ta_2O_3$), and lead scandium tantalum oxide (PbScTaO).

Referring to FIGS. 2, 3, and 4A, the channel pattern CH may have a sidewall that is not covered with the gate spacer GS such that a portion of the sidewall of the channel pattern CH is exposed. The gate spacer GS may include a spacer opening GSO that exposes the channel pattern CH. The gate spacer GS may have a first spacer sidewall GSw1 that is exposed when viewed from the first direction D1, and also have a second spacer sidewall GSw2 that is exposed when viewed from the second direction D2 and that corresponds to an inner sidewall of the spacer opening GSO.

Referring to FIGS. 2, 3, and 4A, the spacer opening GSO may expose the sidewall of the channel pattern CH and a sidewall of the gate dielectric layer Gox adjacent to the channel pattern CH. A recess region R1 may be formed on the active pattern AP adjacent to a side of the spacer opening GSO. An inner sidewall of the recess region R1 may be defined by the sidewall of the channel pattern CH and the sidewall of the gate dielectric layer Gox adjacent to the channel pattern CH, which sidewalls are exposed to the spacer opening GSO.

A source/drain pattern SD may be disposed in the recess region R1. The source/drain pattern SD may include a first source/drain pattern SP1 and a second source/drain pattern SP2. The first source/drain pattern SP1 and the second source/drain pattern SP2 may each include germanium. The first source/drain pattern SP1 and the second source/drain pattern SP2 may include, for example, silicon-germanium. The first source/drain pattern SP1 may have a germanium content less than a germanium content of the second source/drain pattern SP2. The first source/drain pattern SP1 and the second source/drain pattern SP2 may further include P-type impurities, for example, boron, and the unit transistor UT may be a PMOS transistor. The unit transistor UT may be a gate-all-around type transistor. The unit transistor UT may also be a multi-bridge channel field effect transistor (MBCFET).

Referring to the cross-section along line A-A' in FIG. 3, the first source/drain pattern SP1 may cover the inner sidewall and a bottom surface of the recess region R1. For example, the first source/drain pattern SP1 may contact the sidewall of the channel pattern CH, the sidewall of the gate dielectric layer Gox adjacent to the channel pattern CH, and the top surface of the active pattern AP. The first source/drain pattern SP1 may have a first sidewall thickness Tsc at the sidewall of the recess region R1. The first source/drain pattern SP1 may have a bottom thickness Tb at the bottom surface of the recess region R1. The first sidewall thickness Tsc may be less than the bottom thickness Tb. The first sidewall thickness Tsc may increase with decreasing distance from (that is, closer to) the active pattern AP or the substrate 100. For example, the first source/drain pattern SP1 may have the first thickness Tsc at a first height relative to the substrate, and may become thicker to have the bottom thickness Tb at the bottom surface of the recess region R1.

Referring to FIGS. 3 and 4A, the second source/drain pattern SP2 may be spaced apart, for example, by the first source/drain pattern SP1, from the sidewall of the channel pattern CH, the sidewall of the gate dielectric layer Gox adjacent to the channel pattern CH, and the top surface of the active pattern AP. The second source/drain pattern SP2 may fill the recess region R1. Referring to the cross-section along line A-A' of FIG. 3, a portion of the second source/drain pattern SP2 may protrude outwardly, for example, in the third direction D3, from the recess region R1 and may contact a sidewall of the gate spacer GS. The portion of the second source/drain pattern SP2 may contact a bottom surface of the gate spacer GS exposed in the spacer opening GSO. Referring to the cross-section along line C-C' of FIG. 3, the second source/drain pattern SP2 may have a rhombic or diamond-shaped cross-section.

Referring to FIGS. 2 and 3, a space between the gate electrodes GE may be filled with an interlayer dielectric layer IL. The interlayer dielectric layer IL may include one or more of a silicon oxide layer, a silicon nitride layer, a silicon oxynitride layer, and a porous layer. The interlayer dielectric layer IL may have a top surface coplanar with that of the gate capping pattern GP. The interlayer dielectric layer IL may cover upper sides of the second source/drain pattern SP2. The interlayer dielectric layer IL may cover lower sides of the second source/drain pattern SP2 and the top surface of the device isolation layer ST. Although not shown, a contact plug may penetrate the interlayer dielectric layer IL and contact the second source/drain pattern SP2.

Referring to FIGS. 3 and 4A to 4C, at a height of one of the first, second, and third gate segments G1, G2, and G3 of the gate electrode GE, the first source/drain pattern SP1 may contact the sidewall of the gate dielectric layer Gox, which sidewall is exposed through the spacer opening GSO, and also contact the second spacer sidewall GSw2 of the gate spacer GS. The first source/drain pattern SP1 may have a thickness that is mostly constant regardless of position at a certain height. For example, as shown in FIGS. 3 and 4A, the first source/drain pattern SP1 may have the first sidewall thickness Tsc at a height of the second gate segment G2 and at a center of the spacer opening GSO. The first source/drain pattern SP1 may have a second sidewall thickness Tse at the same height and at an edge of the spacer opening GSO. The second sidewall thickness Tse may be about 0.7 to 1 times the first sidewall thickness Tsc. The second sidewall thickness Tse may be 3 nm or more. The second sidewall thickness Tse may range from 3 nm to 7 nm.

For example, a height of a certain one of the first, second, and third gate segments G1, G2, and G3 may mean a height at a center of the certain gate segment. In this case, a height of the second gate segment G2 may correspond to a height at a center of the second gate segment G2. For another example, a height of a certain one of the first, second, and third gate segments G1, G2, and G3 may mean a height at a top surface or bottom surface of the certain gate segment. In this case, a height of the second gate segment G2 may correspond to a height of a top surface or bottom surface of the second gate segment G2. A height of the second gate segment G2 may indicate a height at a certain position between a top surface of the first semiconductor pattern CP1 and a bottom surface of the second semiconductor pattern CP2. A height of the first gate segment G1 may indicate a height at a certain position between the top surface of the active pattern AP and a bottom surface of the first semiconductor pattern CP1. A height of the third gate segment G3 may indicate a height at a certain position between a top surface of the second semiconductor pattern CP2 and a bottom surface of the third semiconductor pattern CP3.

The first sidewall thickness Tsc may be a sidewall center thickness. The second sidewall thickness Tse may be a sidewall edge thickness. Although FIGS. 4A to 4C each show, as an example, a plan view at the height of the second gate segment G2, a plan view at the height of one of the first and third gate segments G1 and G3 may be similar to the plan view at the height of the second gate segment G2, and the explanation discussed above may be identically or similarly applicable to a relationship between the first and second sidewall thicknesses Tsc and Tse at the height of one of the first and third gate segments G1 and G3.

The first sidewall thickness Tsc at a certain height (for example, at the height of the second gate segment G2) may correspond to an interval, at the center of the spacer opening GSO, between the second source/drain pattern SP2 and the gate dielectric layer Gox. The second sidewall thickness Tse at the same certain height (for example, at the height of the second gate segment G2) may correspond to an interval, at the edge of the spacer opening GSO, between the second source/drain pattern SP2 and the gate dielectric layer Gox.

As shown in FIG. 4A, the first source/drain pattern SP1 may be flat at the interface with the gate dielectric layer Gox and convex at the interface with the second source/drain pattern SP2, such that the second sidewall thickness Tse is less than the first sidewall thickness Tsc.

In another implementation, as shown in FIG. 4B, the first source/drain pattern SP1 may be flat on both the gate dielectric layer Gox and the second source/drain pattern SP2, such that the second sidewall thickness Tse may be the same or about the same as the first sidewall thickness Tsc.

In another implementation, as shown in FIG. 4C, the gate dielectric layer Gox may be recessed at its lateral surface adjacent to the spacer opening GSO, and/or the gate electrode GE may be recessed at its lateral surface adjacent to the spacer opening GSO. In this case, the first source/drain pattern SP1 may be convex on both the gate dielectric layer Gox and the second source/drain pattern SP2. In this case, the second sidewall thickness Tse may be less than the first sidewall thickness Tsc.

As illustrated in FIG. 4A, a portion of the second source/drain pattern SP2 may be inserted into the spacer opening GSO. The second source/drain pattern SP2 may contact the second spacer sidewall GSw2 of the gate spacer GS. The second source/drain pattern SP2 may have a first width WT1 between neighboring gate spacers GS and a second width WT2 between neighboring first source/drain patterns SP1. The second width WT2 may be greater than the first width WT1.

Figure 4D:
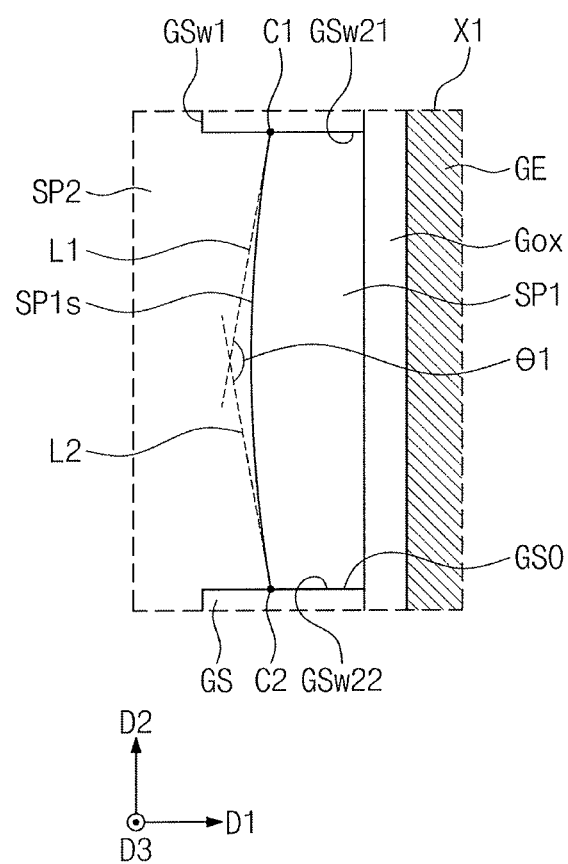
FIG. 4D illustrates an enlarged view showing section X1 of FIG. 4A.

FIG. 4D illustrates an enlarged view showing section X1 of FIG. 4A.

Referring to FIG. 4D, the gate spacer GS may include a 21st sidewall spacer GSw21 and a 22nd sidewall spacer GSw22 that are exposed to the spacer opening GSO and that face each other. The first source/drain pattern SP1 may have an outer sidewall SP1s (facing the second source/drain pattern SP2) that includes a first point C1 where the outer sidewall SP1s meets the 21st sidewall spacer GSw21 and a second point C2 where the outer sidewall SP1s meets the 22nd sidewall spacer GSw22. A first tangent line L1 passing through the first point C1 and a second tangent line L2 passing through the second point C2 may make a first angle θ1 with each other that ranges, for example, from 150° to 180°.

A semiconductor device according to an example embodiment may include the first source/drain pattern SP1 whose thickness is mostly constant at a certain height and is at least 3 nm, and as a result, it may be possible to reduce defects in fabricating the semiconductor device and to increase reliability of the semiconductor device.

Figure 5:
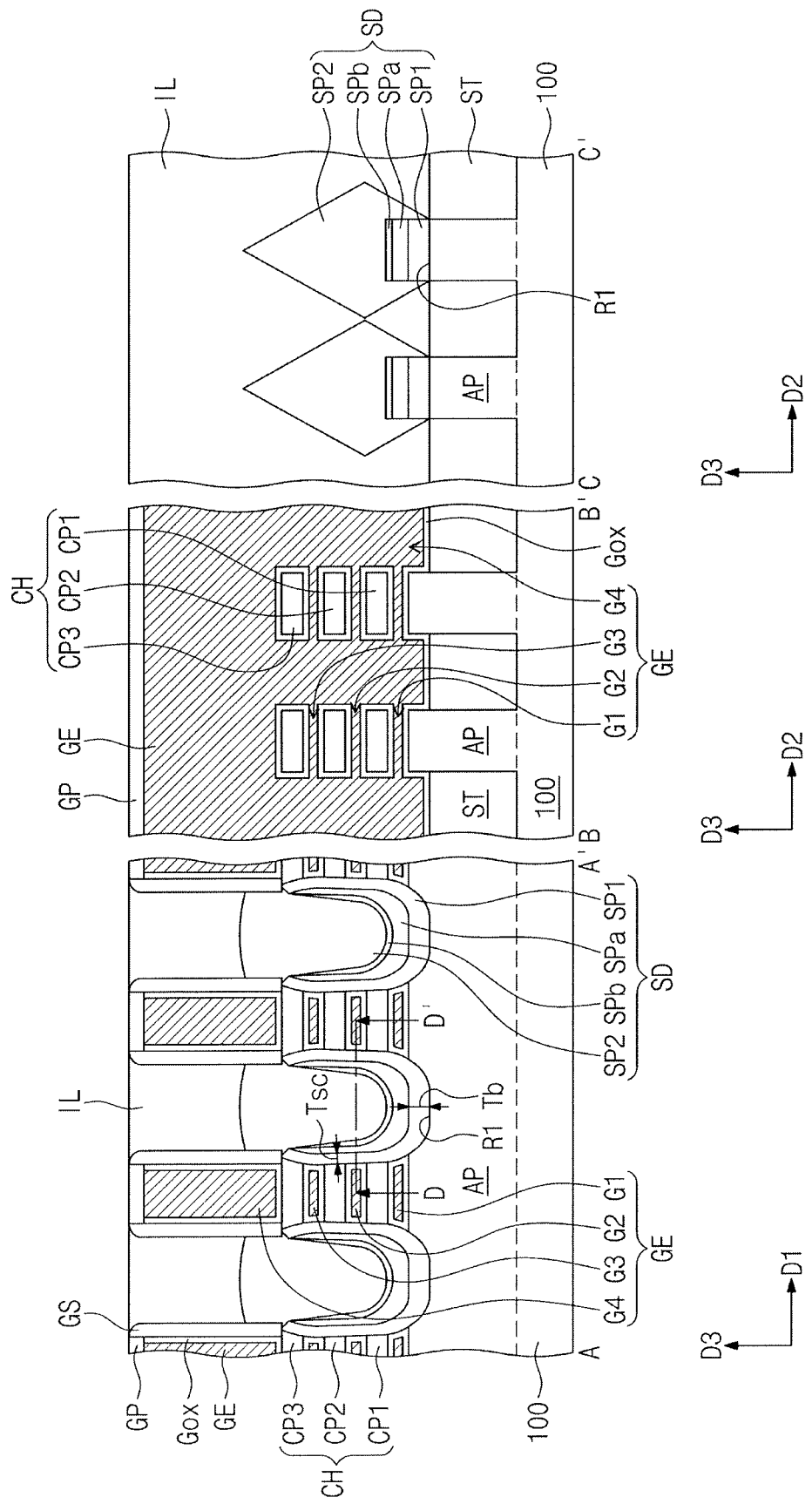
FIG. 5 illustrates cross-sectional views taken along lines A-A', B-B', and C-C' of FIG. 1.
Figure 6A:
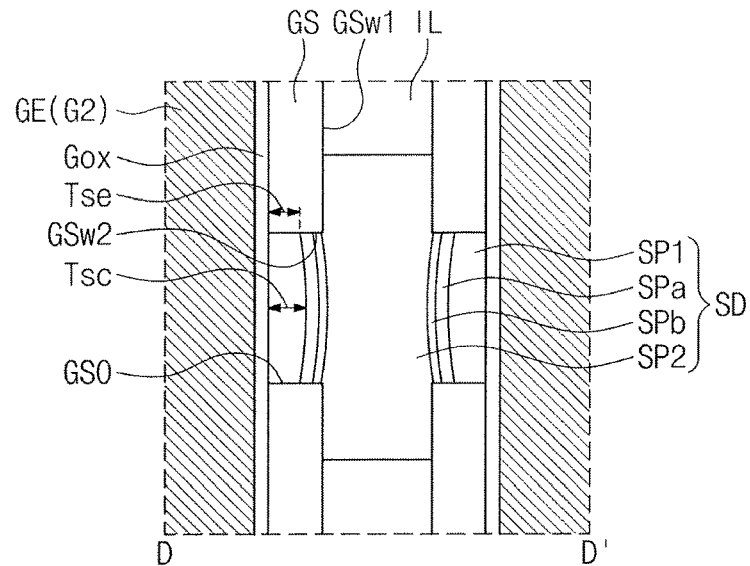
FIGS. 6A and 6B illustrate plan views taken along line D-D' of FIG. 5.
Figure 6B:
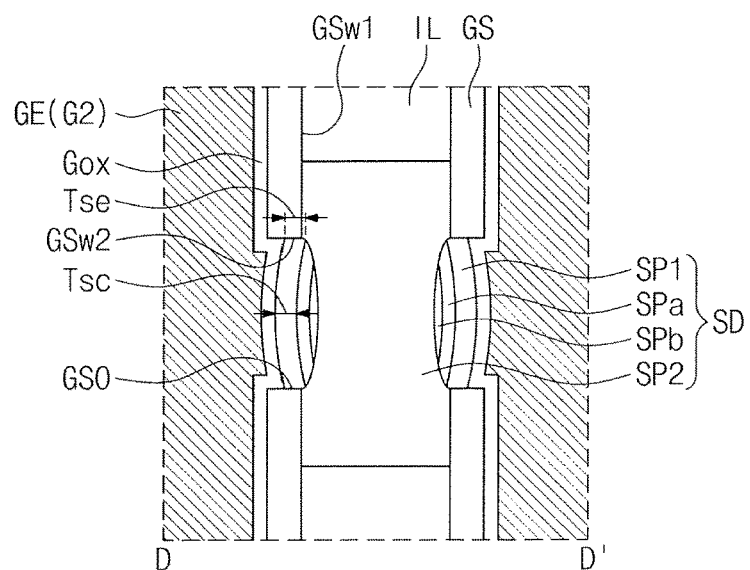

FIG. 5 illustrates cross-sectional views taken along lines A-A', B-B', and C-C' of FIG. 1, according to an example embodiment. FIGS. 6A and 6B illustrate plan views taken along line D-D' of FIG. 5, according to an example embodiment.

Referring to FIG. 5, a first subsidiary source/drain pattern SPa and a second subsidiary source/drain pattern SPb may be interposed between the first source/drain pattern SP1 and the second source/drain pattern SP2. The first subsidiary source/drain pattern SPa may cover a surface of the first source/drain pattern SP1. The second subsidiary source/drain pattern SPb may cover a surface of the first subsidiary source/drain pattern SPa. The first and second subsidiary source/drain patterns SPa and SPb may each include germanium. The first and second subsidiary source/drain patterns SPa and SPb may include, for example, silicon-germanium. The first and second subsidiary source/drain patterns SPa and SPb may have respective germanium contents that are different from each other. The germanium content of the first subsidiary source/drain pattern SPa may be greater than that of the first source/drain pattern SP1 and less than that of the second subsidiary source/drain pattern SPb. The germanium content of the second subsidiary source/drain pattern SPb may be greater than that of the first subsidiary source/drain pattern SPa and less than that of the second source/drain pattern SP2. Although FIGS. 5, 6A, and 6B show that two subsidiary source/drain patterns, or the first and second subsidiary source/drain patterns SPa and SPb, are interposed between the first source/drain pattern SP1 and the second source/drain pattern SP2, only one of the first and second subsidiary source/drain patterns SPa and SPb may be interposed between the first source/drain pattern SP1 and the second source/drain pattern SP2. In another implementation, three or more subsidiary source/drain patterns may be interposed between the first source/drain pattern SP1 and the second source/drain pattern SP2.

FIGS. 6A and 6B illustrate a structure in which the first source/drain pattern SP1, the second source/drain pattern SP2, the first subsidiary source/drain pattern SPa, and the second subsidiary source/drain pattern SPb are located at a certain height. As shown in FIG. 6A, the first source/drain pattern SP1, the first subsidiary source/drain pattern SPa, and the second subsidiary source/drain pattern SPb may all be convex toward the second source/drain pattern SP2. FIG. 6A shows that the second sidewall thickness Tse may be less than the first sidewall thickness Tsc. FIG. 6A also shows that the second source/drain pattern SP2 may be spaced apart from both the first source/drain pattern SP1 and the first subsidiary source/drain pattern SPa.

In another implementation, as shown in FIG. 6B, the first source/drain pattern SP1 and the first subsidiary source/drain pattern SPa may be convex toward the gate electrode GE, and the second subsidiary source/drain pattern SPb may be convex toward the second source/drain pattern SP2. In this case, the second sidewall thickness Tse may be almost the same as the first sidewall thickness Tsc. As illustrated in FIG. 6B, the second source/drain pattern SP2 may be in contact with an edge of the first source/drain pattern SP1 and with an edge of the first subsidiary source/drain pattern SPa.

FIGS. 7A to 13A illustrate perspective views showing stages in a method of fabricating a semiconductor memory device of FIG. 2. FIGS. 7B to 13B illustrate cross-sectional views showing stages in a method of fabricating a semiconductor device of FIG. 3. FIGS. 7C to 13C illustrate plan views taken along line D-D' of FIGS. 7B to 13B, respectively. FIG. 9D illustrates a plan view taken along line D-D' of FIG. 9B, according to an example embodiment.

Figure 7A:
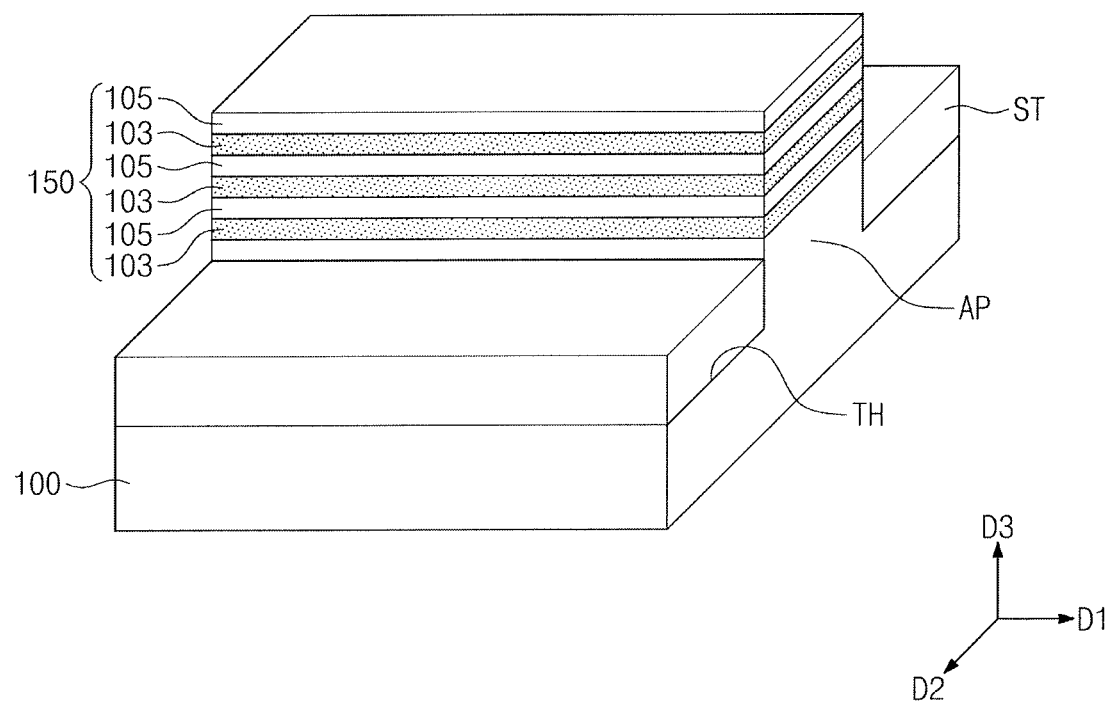
Figure 7B:
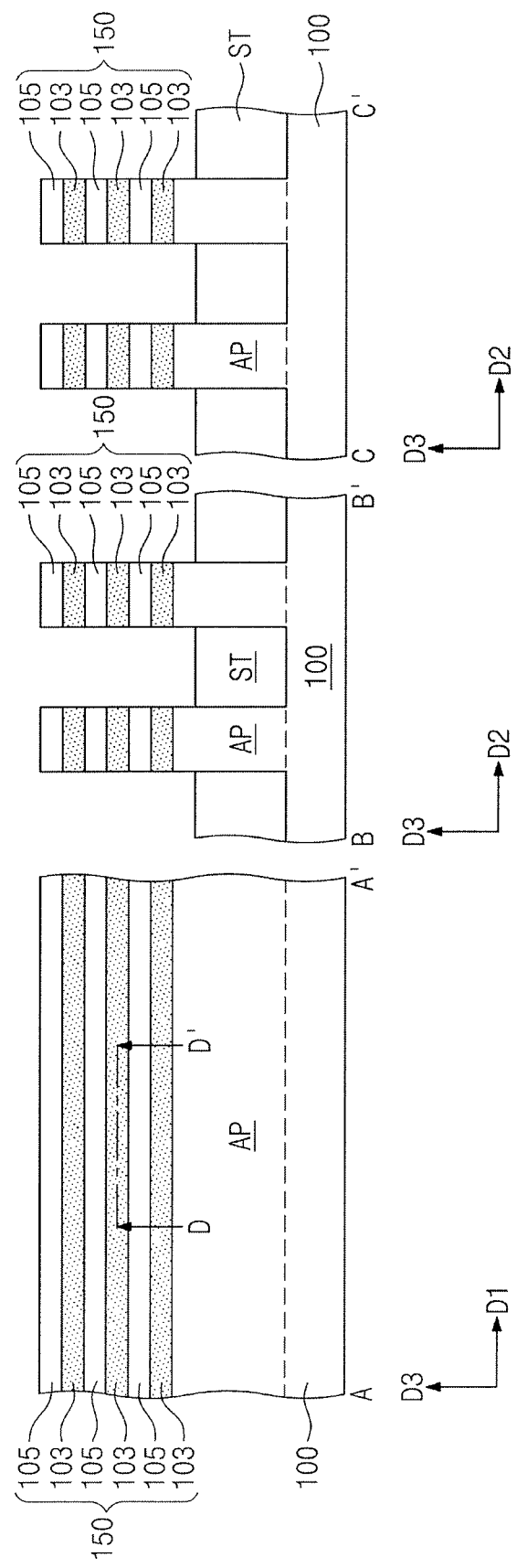
Figure 7C:
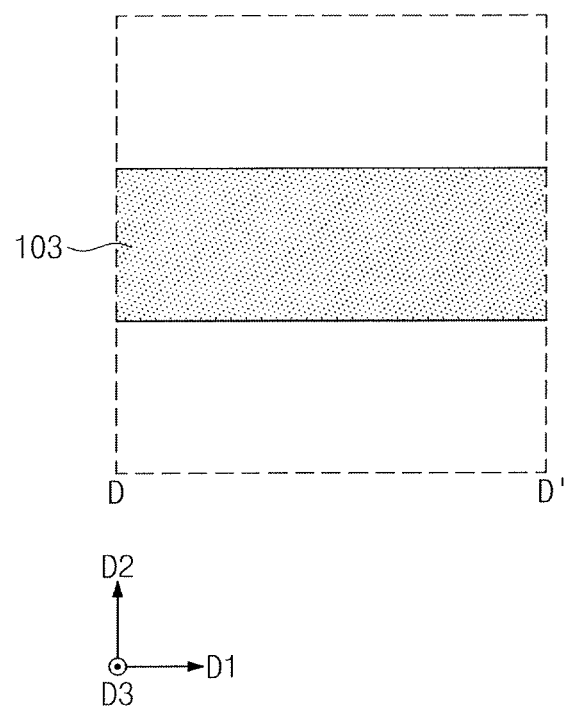

Referring to FIGS. 7A to 7C, sacrificial layers 103 and semiconductor layers 105 may be alternately stacked on a substrate 100. The substrate 100 may be, for example, a single crystalline silicon substrate or a silicon-on-insulator (SOI) substrate. The sacrificial layers 103 may be formed of a material having an etch selectivity with respect to the semiconductor layers 105. The sacrificial layers 103 may be formed of, for example, a silicon-germanium layer. When the sacrificial layers 103 are formed of silicon-germanium (whose lattice constant is greater than that of silicon), a compressive stress may be applied to the semiconductor layers 105. The semiconductor layers 105 may subsequently become a channel pattern (see CH of FIG. 3), and an operating speed of semiconductor devices may be increased due to an improvement of charge mobility.

The semiconductor layers 105, the sacrificial layers 103, and a portion of the substrate 100 may be etched to form a trench TH in the substrate 100 and simultaneously to form an active pattern AP and a stack structure 150 on the active pattern AP that protrudes from the substrate 100. The stack structure 150 may include the sacrificial layers 103 and the semiconductor layers 105 that are alternately stacked. The active pattern AP and the stack structure 150 may be formed with a longitudinal length in the first direction D1. In addition, each of the active pattern AP and the stack structure 150 may be formed in plural spaced apart from each other in the second direction D2. A dielectric layer may be formed on the substrate 100, and then etched-back to form a device isolation layer ST that fills the trench TH. The device isolation layer ST may be formed to have a top surface lower than that of the active pattern AP.

Figure 8A:
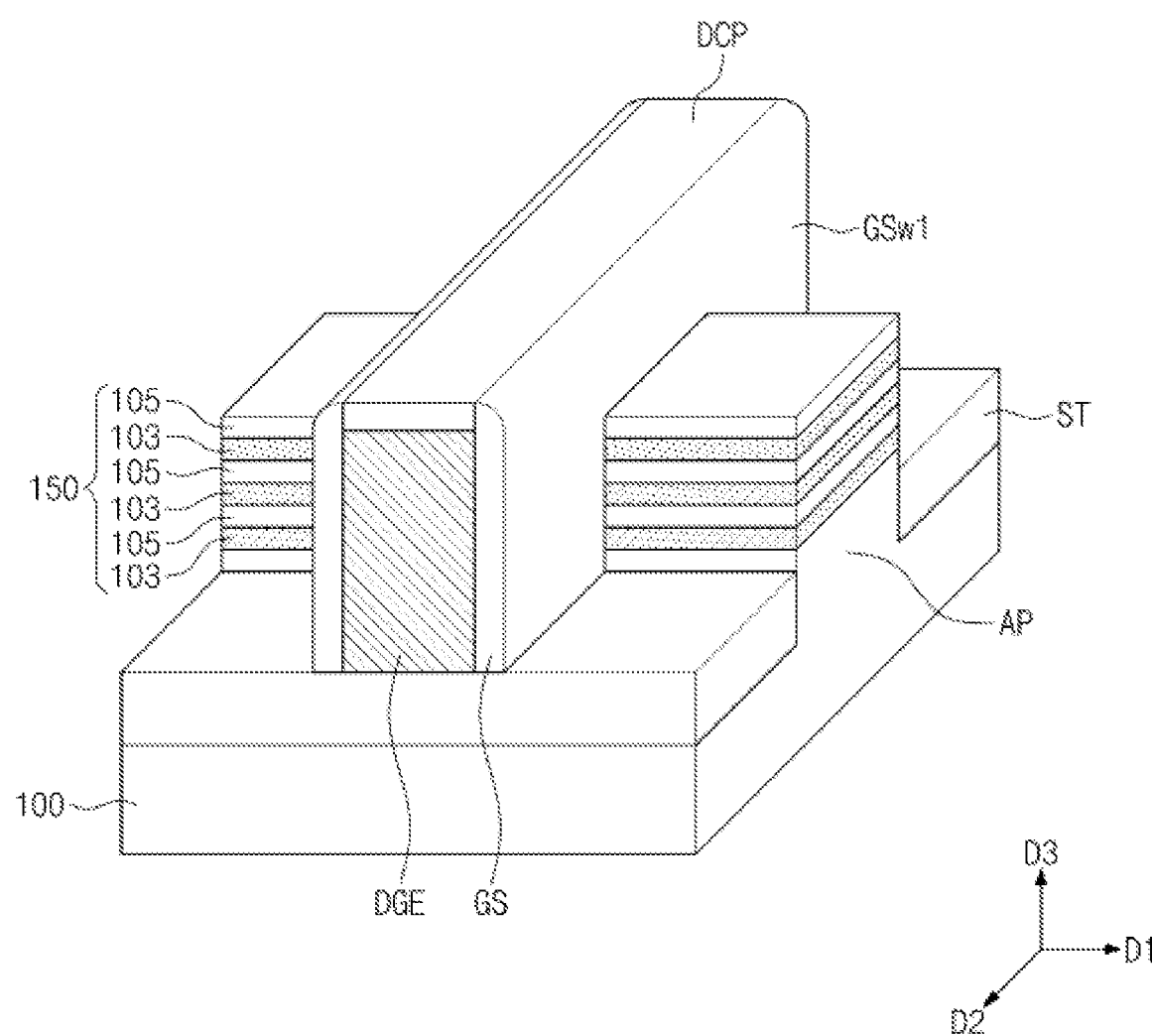
Figure 8B:
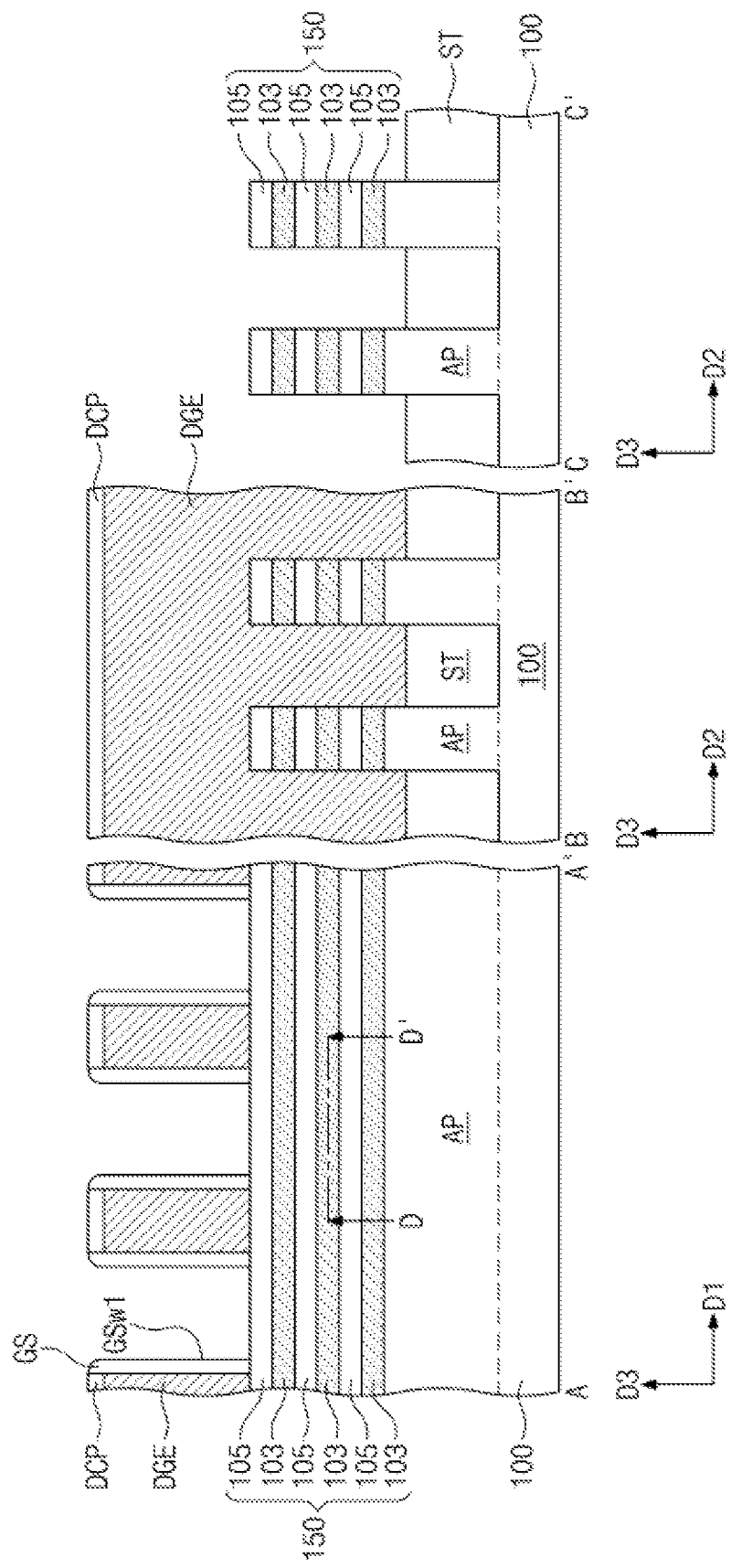
Figure 8C:
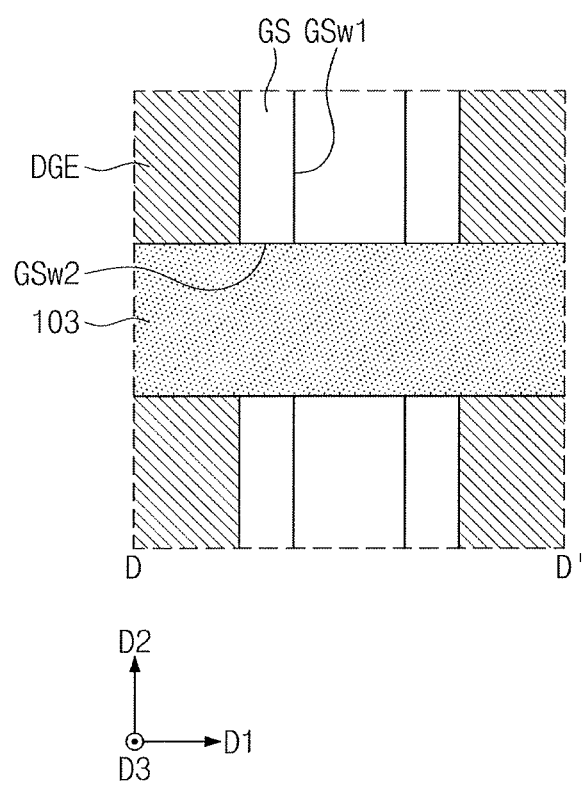

Referring to FIGS. 8A to 8C, a dummy gate layer and a dummy capping layer may be formed on an entire surface of the substrate 100, and then patterned to form a dummy gate electrode DGE and a dummy capping pattern DCP that cross the stack structure 150 and the active pattern AP. The dummy gate electrode DGE may be formed of a material having an etch selectivity with respect to the stack structure 150 and the active pattern AP. The dummy gate electrode DGE may include, for example, polysilicon. The dummy capping pattern DCP may include a dielectric layer, such as a silicon nitride layer. A spacer layer may be stacked on the entire surface of the substrate 100, and then anisotropically etched to form a gate spacer GS that covers a sidewall of the dummy gate electrode DGE and a sidewall of the dummy capping pattern DCP. The gate spacer GS may have a single-layered or multi-layered structure formed of one or more of a silicon nitride layer, a silicon oxide layer, and a silicon oxynitride layer. After the gate spacer GS is formed, a top surface of the stack structure 150 may be exposed. Although not shown, the gate spacer GS may be formed to cover a lateral surface of the stack structure 150 that laterally protrudes from a side of the dummy gate electrode DGE, but a separate or subsequent process may remove the gate spacer GS formed on the lateral surface of the stack structure 150. Therefore, the lateral surface of the stack structure 150 that laterally protrudes from the side of the dummy gate electrode DGE may be exposed, but not be covered with the gate spacer GS. The gate spacer GS may have a first spacer sidewall GSw1 exposed in the first direction D1 and a second spacer sidewall GSw2 in contact with the sacrificial layers 103 and the semiconductor layers 105 of the stack structure 150.

Figure 9A:
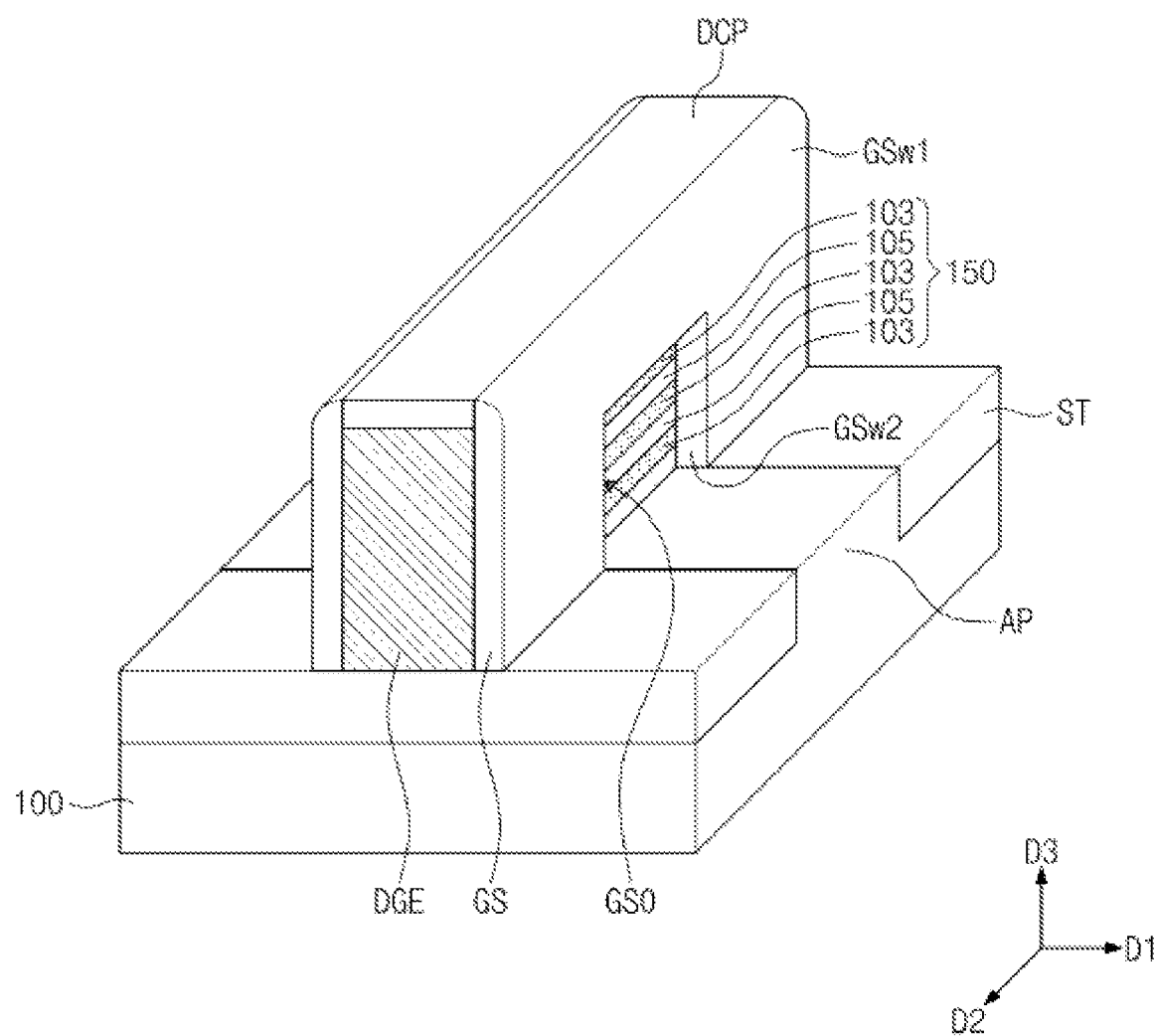
Figure 9B:
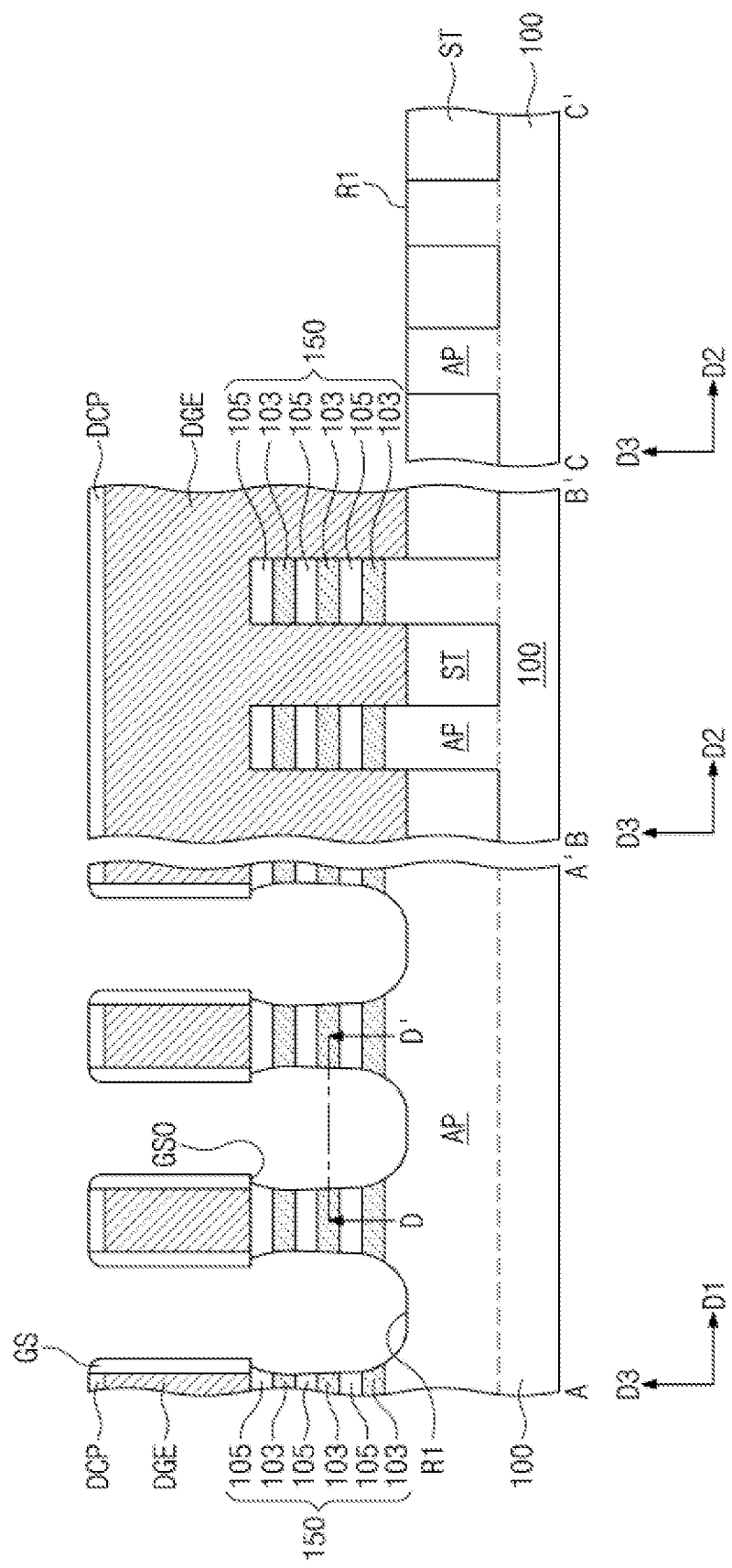
Figure 9C:
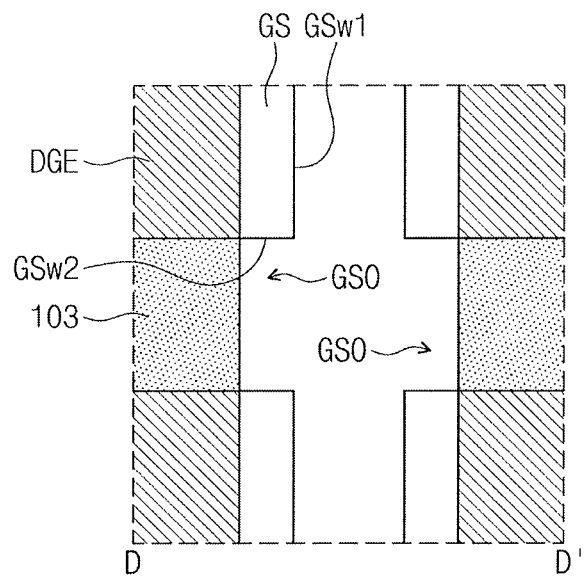
Figure 9C:
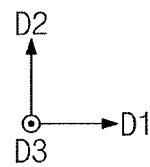
Figure 9D:
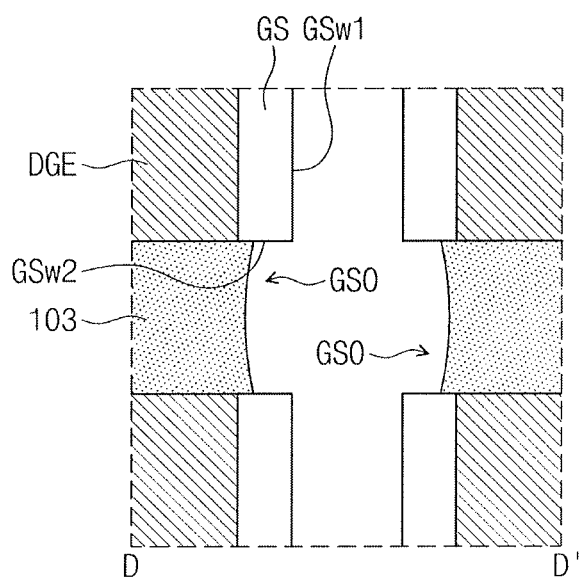
FIG. 9D illustrates a plan view taken along line D-D' of FIG. 9B.
Figure 9D:
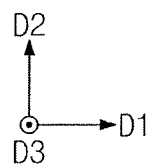

Referring to FIGS. 9A to 9C, the stack structure 150 exposed on the side of the gate spacer GS may be etched to form a recess region R1 that exposes the active pattern AP. The etching of the stack structure 150 may include an anisotropic etching process and an isotropic etching process. The etching processes may partially remove an upper portion of the active pattern AP. The etching processes may expose the second spacer sidewall GSw2. A spacer opening GSO may be defined to refer to a space between the second spacer sidewalls GSw2 of the gate spacer GS. The spacer opening GSO may expose the stack structure 150 disposed below the dummy capping pattern DCP. The degree of progress of the etching processes may change the degree of etching of the stack structure 150 and also change a sidewall profile of the stack structure 150. Accordingly, a sidewall profile of the sacrificial layer 103 of the stack structure 150 may be flat as shown in FIG. 9C or may be laterally recessed as shown in FIG. 9D. In the case of FIG. 9D, subsequent processes may be performed to eventually form the structure shown in FIG. 4C or 6B.

Figure 10A:
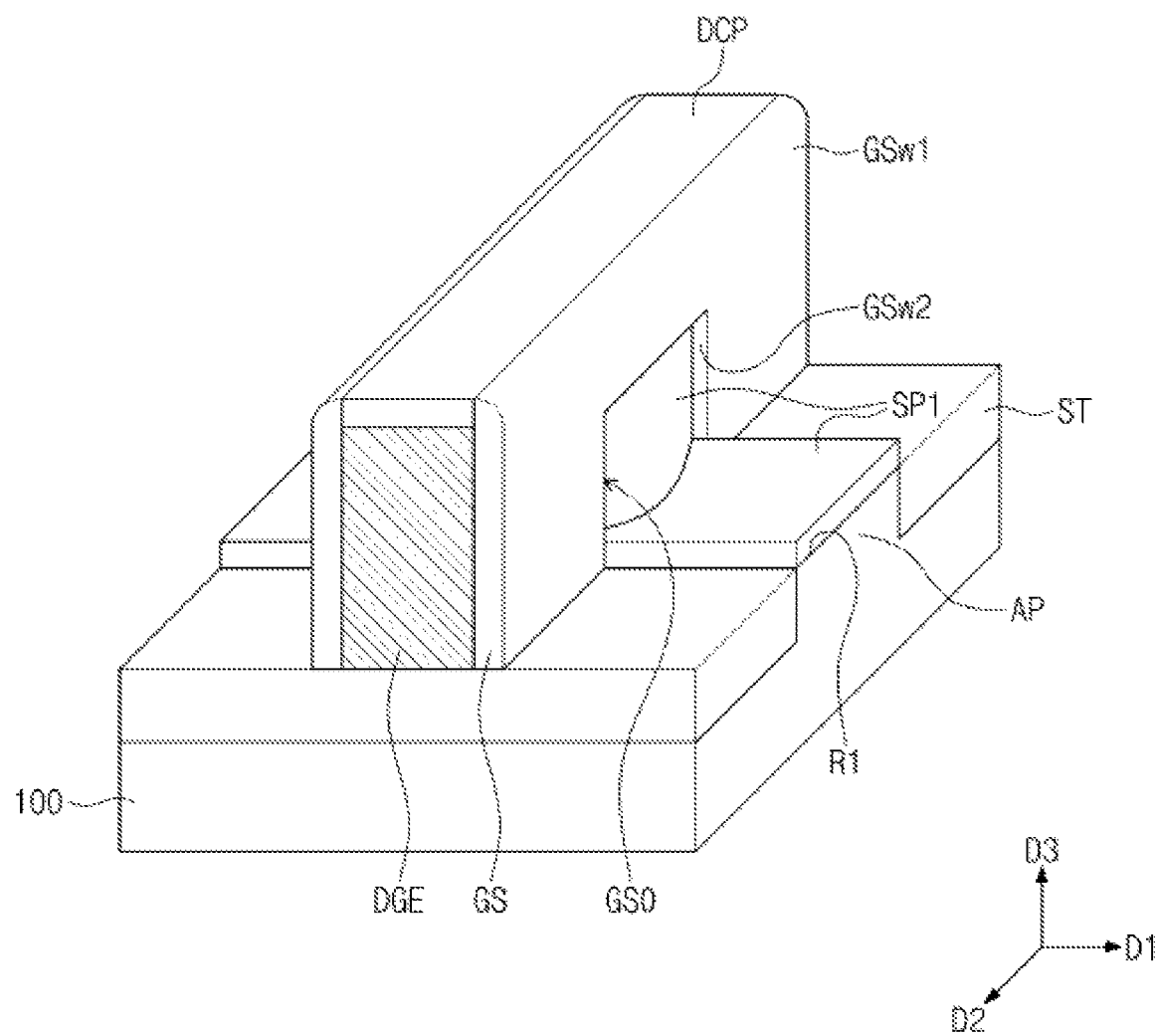
Figure 10B:
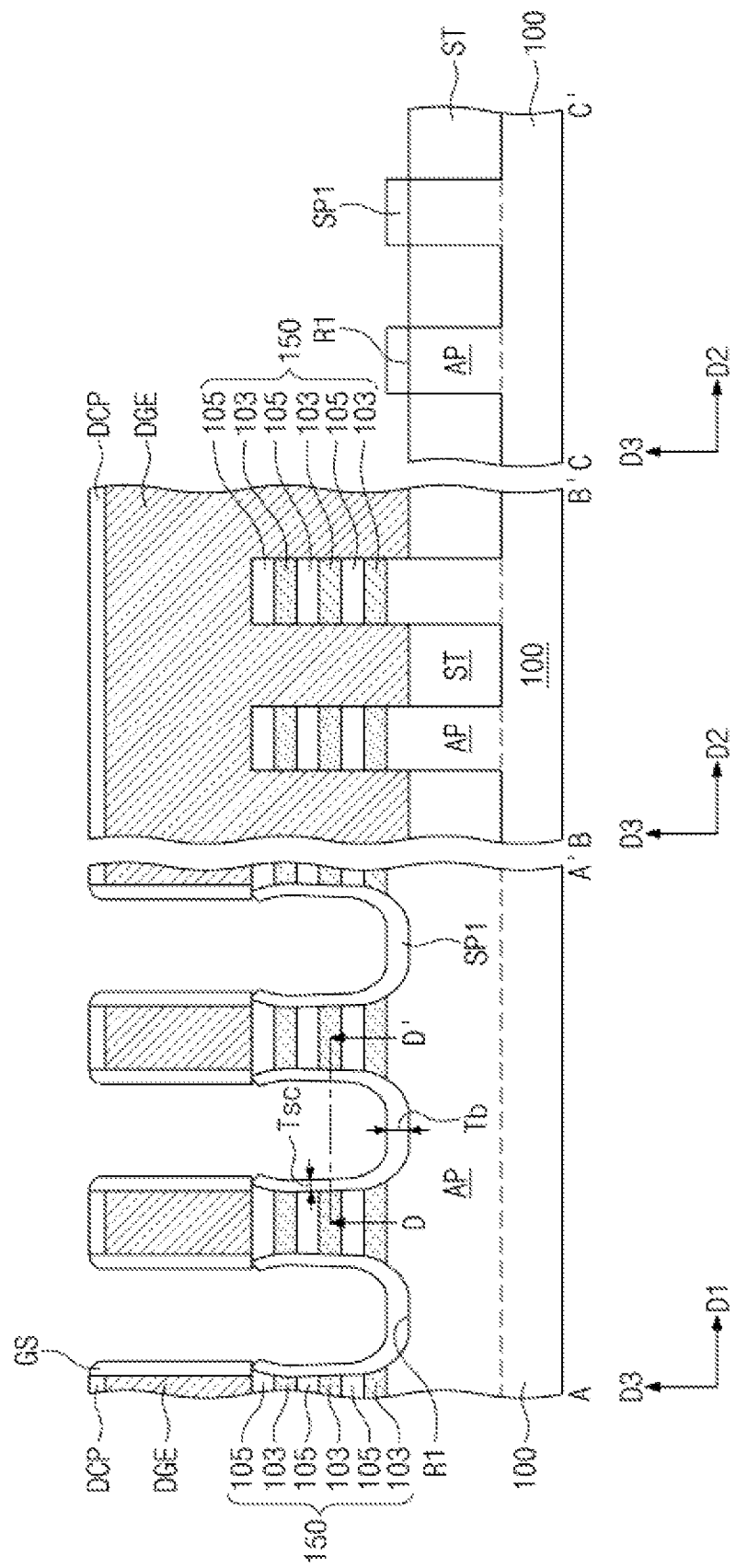
Figure 10C:
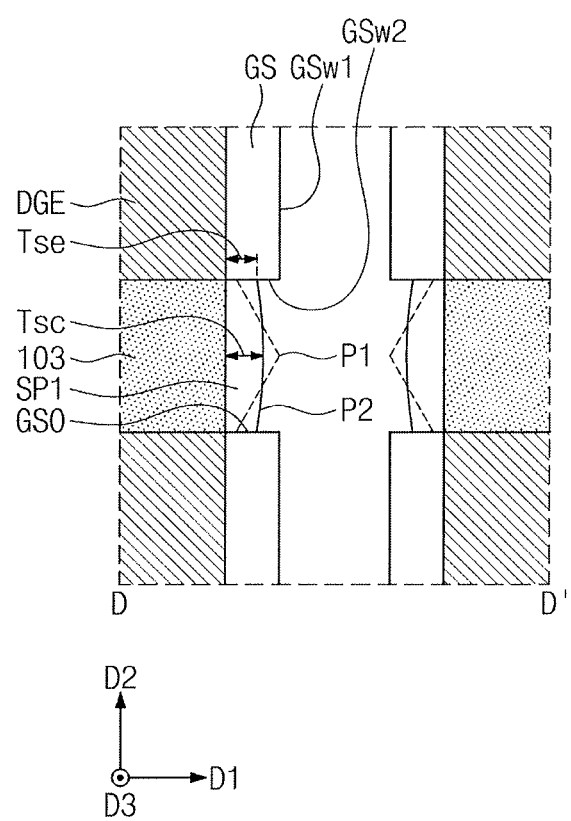

Referring to FIGS. 10A to 10C, a first source/drain pattern SP1 may be formed to cover a sidewall and a bottom of the recess region R1. The first source/drain pattern SP1 may be formed to include germanium. The first source/drain pattern SP1 may be, for example, a silicon-germanium layer. The first source/drain pattern SP1 may have a germanium content different from that of the sacrificial layer 103. The germanium content of the first source/drain pattern SP1 may be less than that of the sacrificial layer 103.

The formation of the first source/drain pattern SP1 may include performing a selective epitaxial growth (SEG) process as a first step and performing a reflow process as a second step. The first-step SEG process may be performed under a first pressure at a first temperature with supplied silicon and germanium source gases. The silicon source gas may be, for example, SiH$_4$. The germanium source gas may be, for example, GeH$_4$. The first temperature may range, for example, from 600° C. to 700° C. The first pressure may range, for example, from 250 Torr to 350 Torr. The first temperature may be, for example, 630° C., and the first pressure may be, for example, 300 Torr. Hydrogen may further be supplied in the first-step SEG process. As shown in FIG. 10C, the first source/drain pattern SP1 formed after the first-step SEG process may have a sidewall profile such as represented by a dotted line P1 at a certain height. For example, the first source/drain pattern SP1 may be extremely thick at a center of the spacer opening GSO and significantly thin at an edge of the spacer opening GSO.

The second-step reflow process may be performed. The second-step reflow process may be performed under a second pressure at a second temperature with supplied hydrogen. The second temperature may be the same as the first temperature. The second pressure may be less than the first pressure. The second pressure may be one-ninth to one-eleventh of the first pressure. The second pressure may be, for example, 30 Torr. Hydrogen may serve to cure defects in the second-step reflow process. The second-step reflow process may rearrange a crystal structure (or lattice) between atoms contained the first source/drain pattern SP1 formed by the first-step SEG process, and as shown in FIG. 10C, the sidewall profile of the first source/drain pattern SP1 may be changed into a new profile such as represented by a solid line P2 at a certain height. Therefore, the first source/drain pattern SP1 may have a thickness that is mostly constant at both the center and the edge of the spacer opening GSO.

In an embodiment, the second-step reflow process may cause the first source/drain pattern SP1 at a certain height to have a first sidewall thickness Tsc at the center of the spacer opening GSO and a second sidewall thickness Tse at the edge of the spacer opening GSO. Preferably, the second sidewall thickness Tse may be about 0.7 to 1 times the first sidewall thickness Tsc. The second sidewall thickness Tse may be, for example, 3 nm or more. For example, the second sidewall thickness Tse may range from 3 nm to 7 nm.

In addition, the second-step reflow process may cause the first source/drain pattern SP1 to have at the bottom of the recess region R1 a bottom thickness Tb greater than the first sidewall thickness Tsc.

Figure 11A:
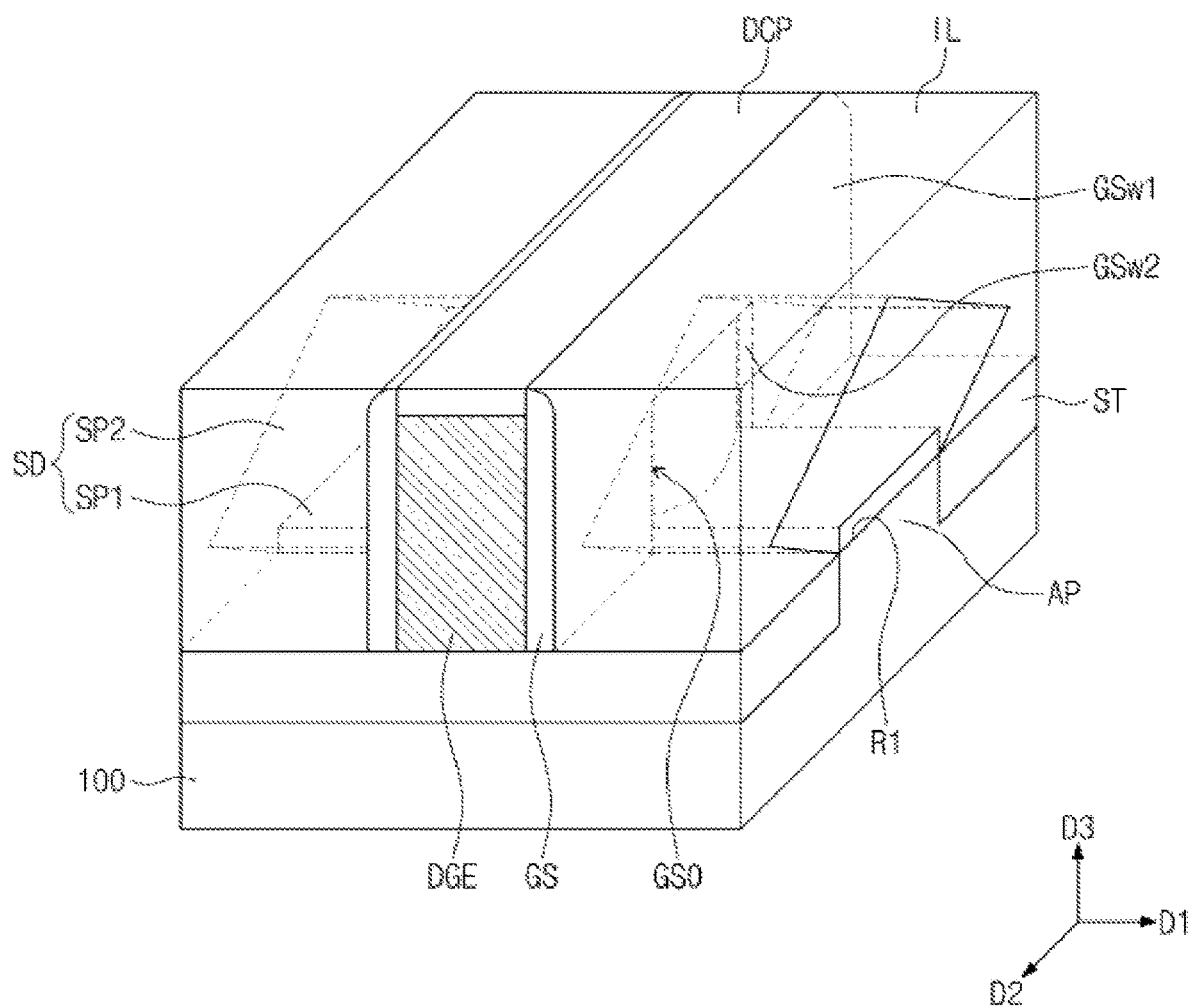
Figure 11B:
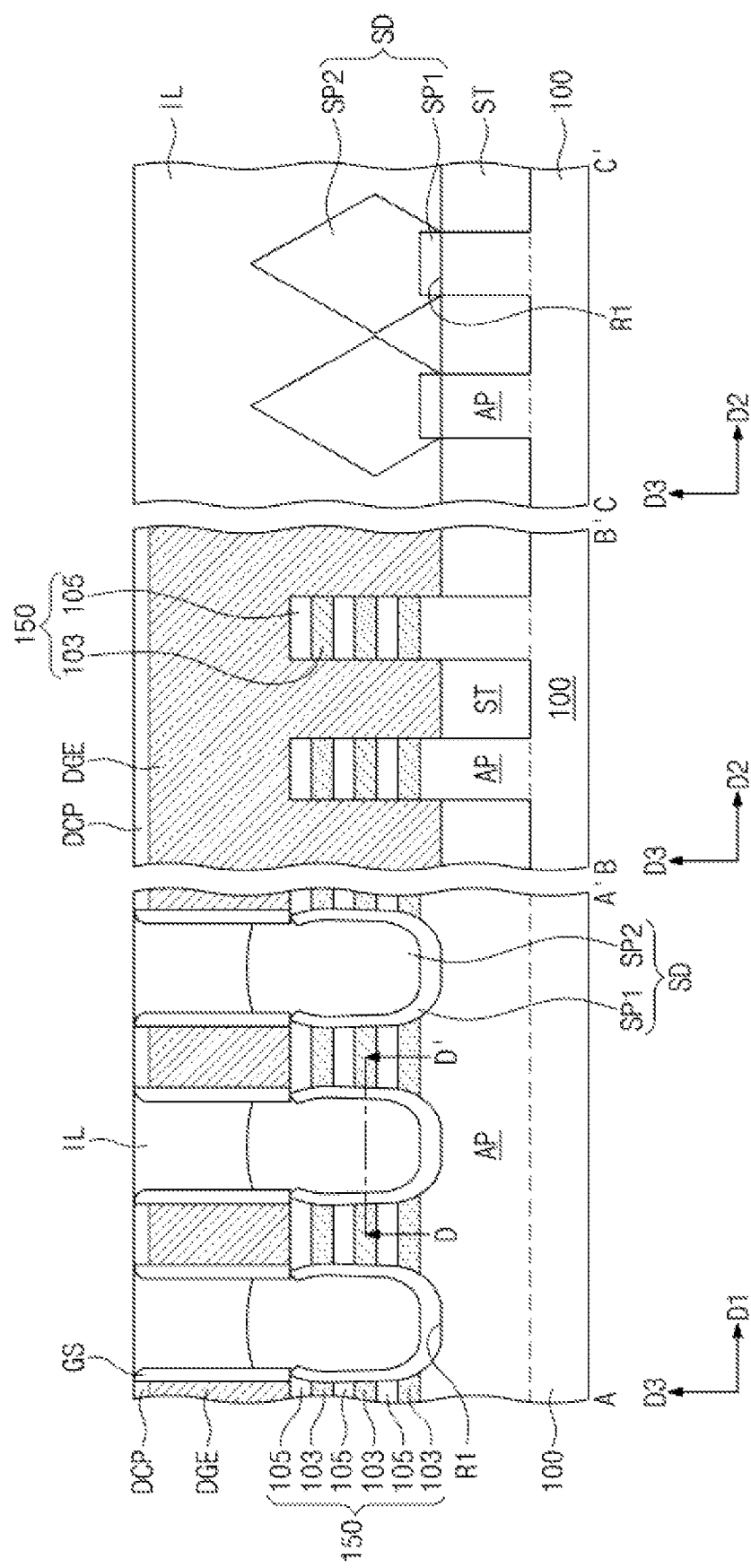
Figure 11C:
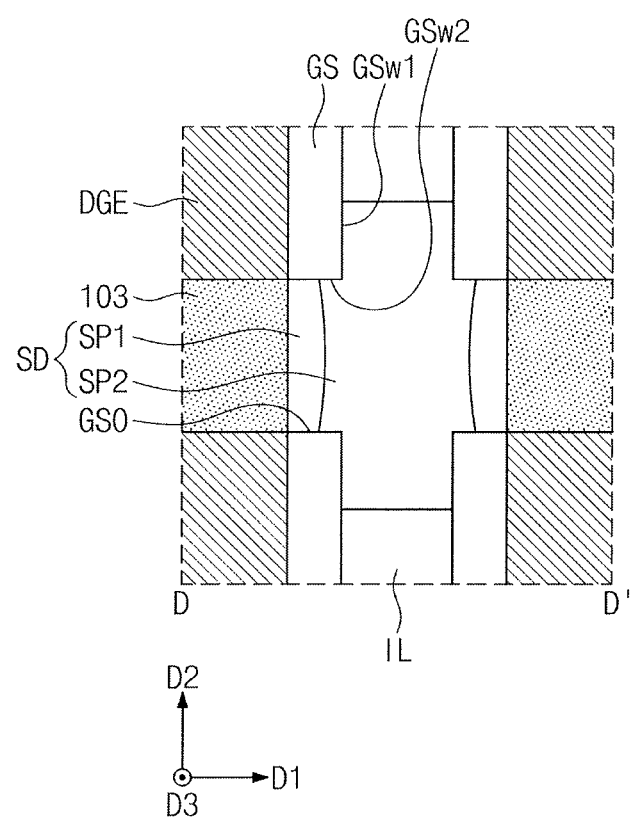

Referring to FIGS. 11A to 11C, a selective epitaxial growth (SEG) process may be performed to form a second source/drain pattern SP2 on the first source/drain pattern SP1. The second source/drain pattern SP2 may fill the recess region R1. The second source/drain pattern SP2 may have a germanium content greater than that of the first source/drain pattern SP1. For example, the second source/drain pattern SP2 may have a germanium content the same as or similar to that of the sacrificial layer 103. After the formation of the second source/drain pattern SP2, an interlayer dielectric layer IL may be formed on the entire surface of the substrate 100, and then may undergo a planarization etching process to expose the dummy capping pattern DCP.

P-type impurities, such as boron, may be doped when forming the first source/drain pattern SP1 and the second source/drain pattern SP2. Boron may be, for example, in-situ doped when a selective epitaxial growth (SEG) process is performed to form each of the first source/drain pattern SP1 and the second source/drain pattern SP2.

Figure 12A:
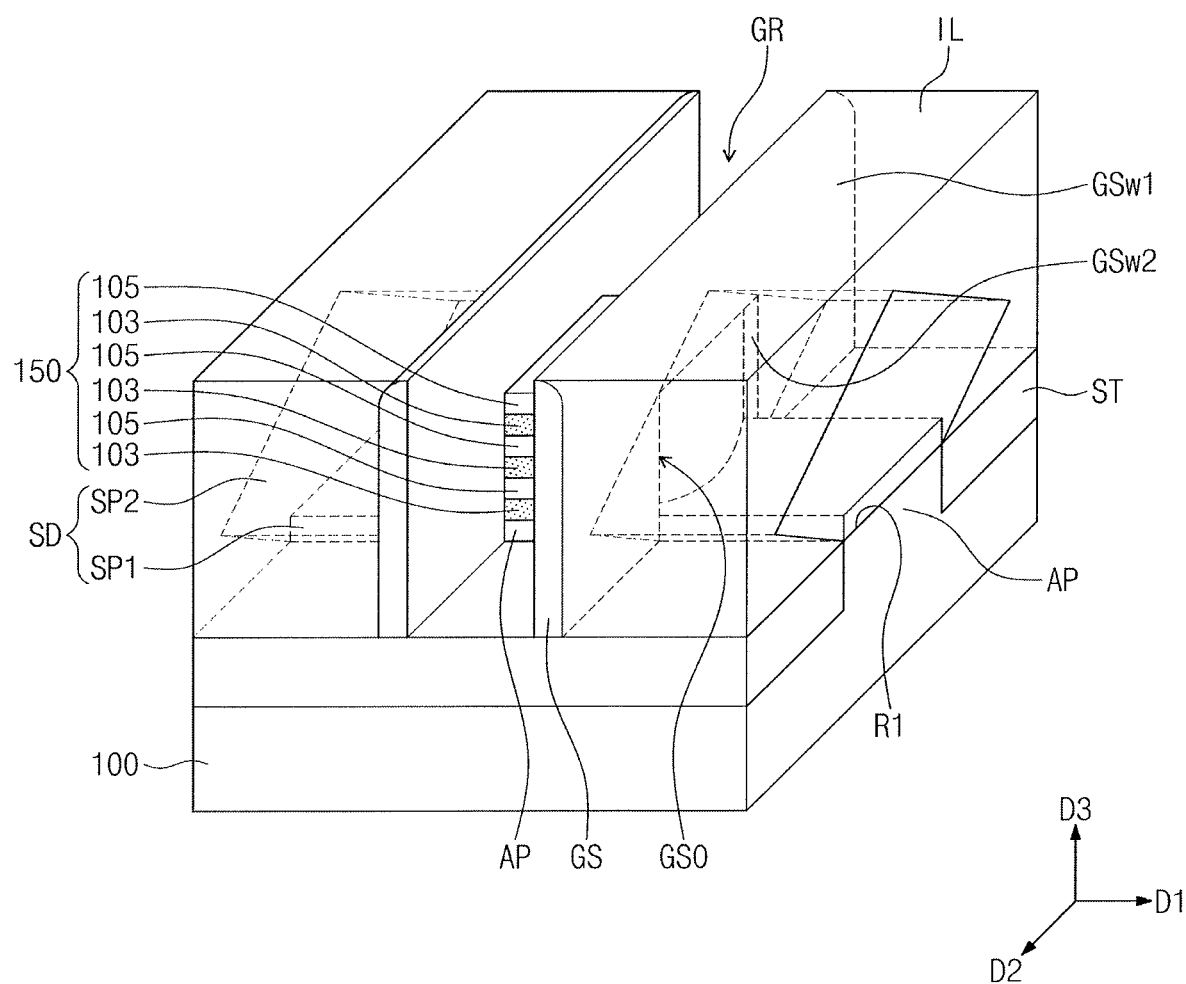
Figure 12B:
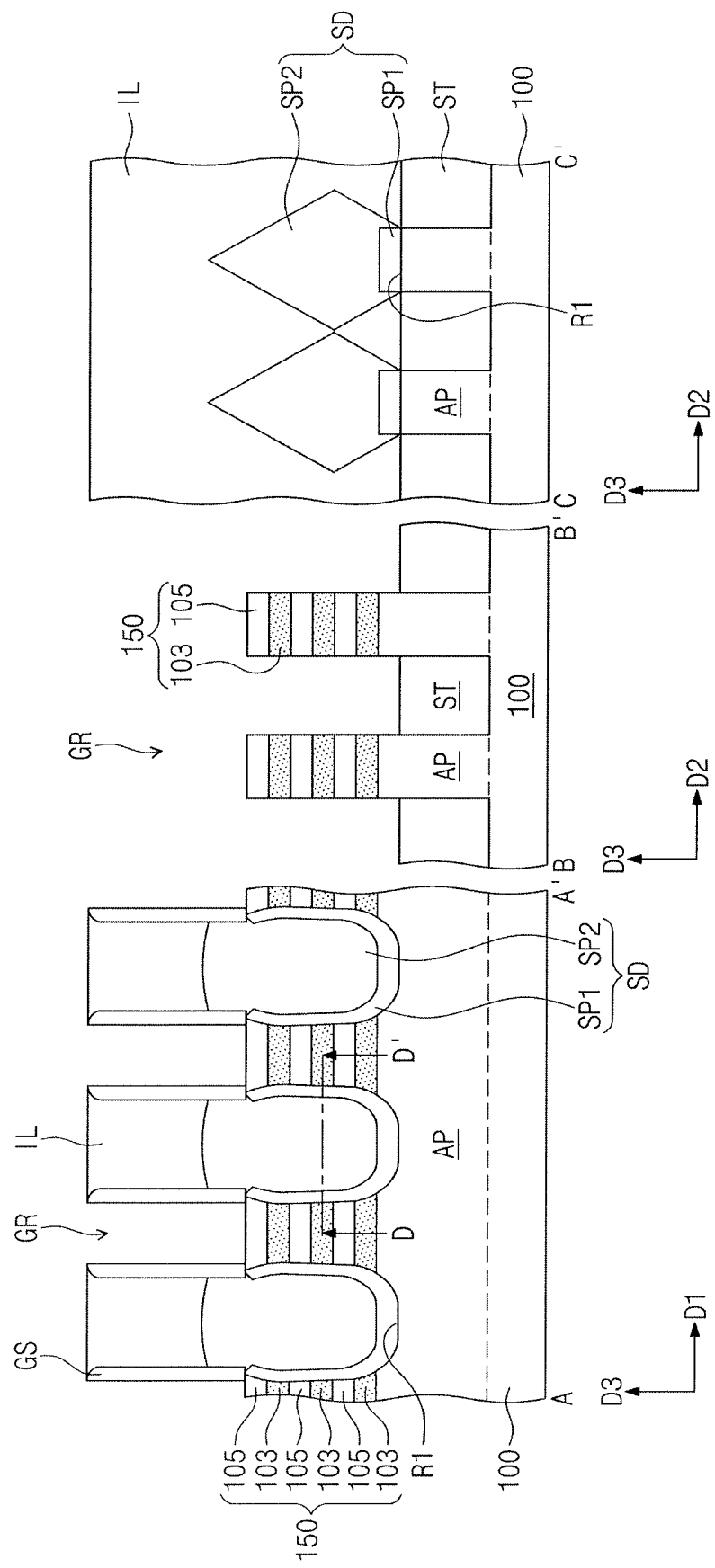
Figure 12C:
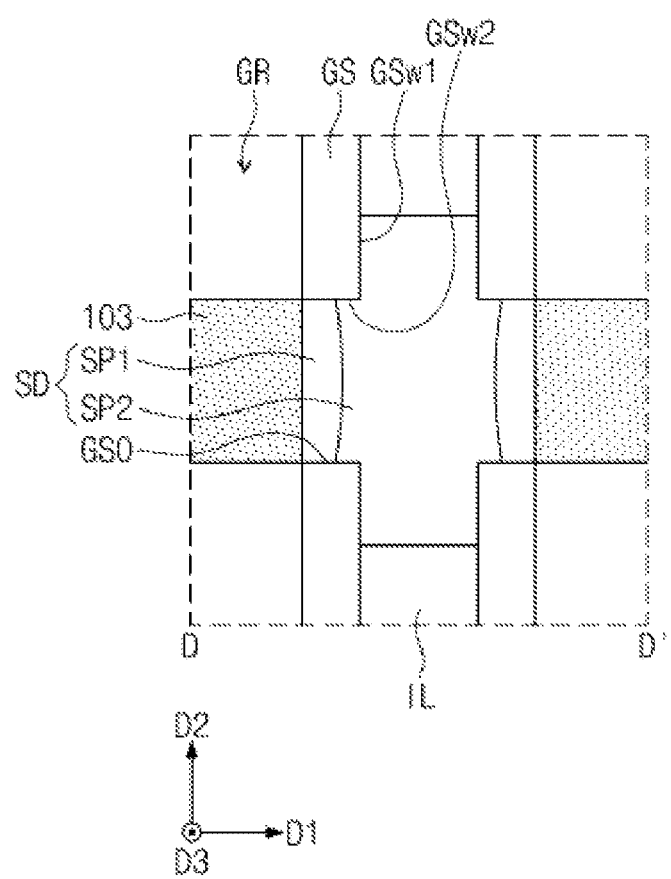

Referring to FIGS. 12A to 12C, the dummy capping pattern DCP and the dummy gate electrode DGE may be removed to form a groove GR that exposes the top surface and the lateral surface of the stack structure 150. In addition, the groove GR may also expose an inner lateral surface of the gate spacer GS and the top surface of the device isolation layer ST adjacent to the gate spacer GS. The exposure of the lateral surface of the stack structure 150 may reveal lateral surfaces of the sacrificial layers 103 that constitute the stack structure 150.

Figure 13A:
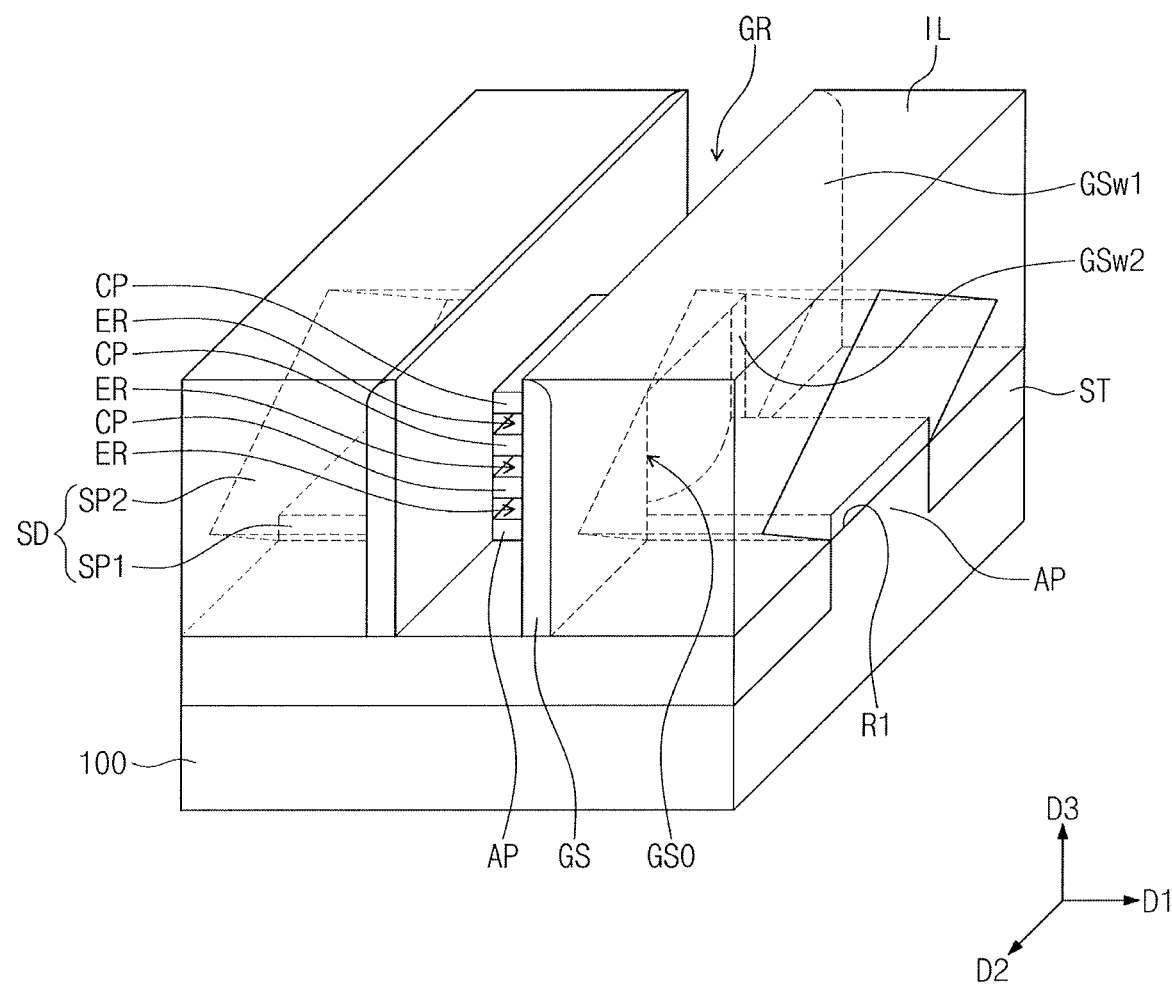
Figure 13B:
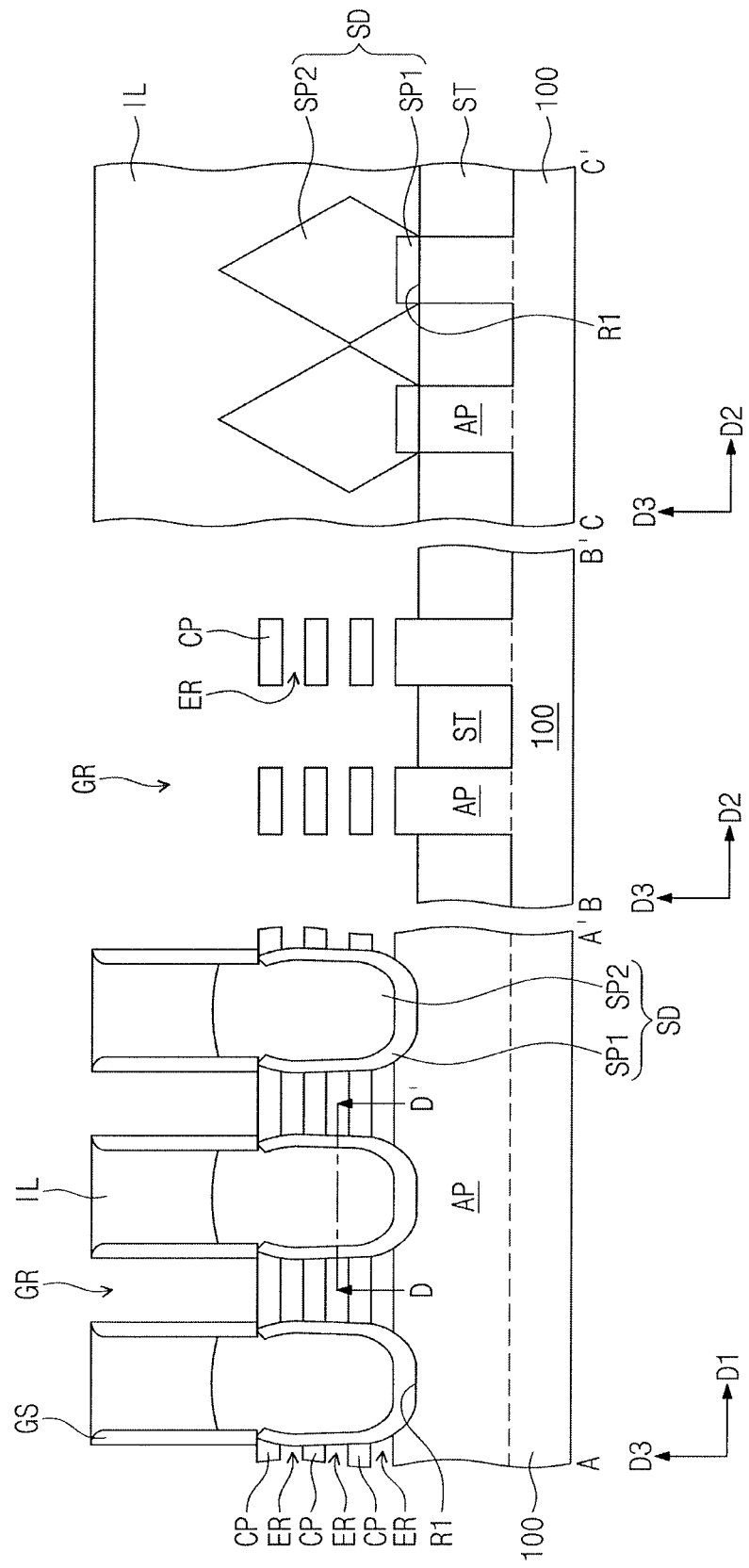
Figure 13C:
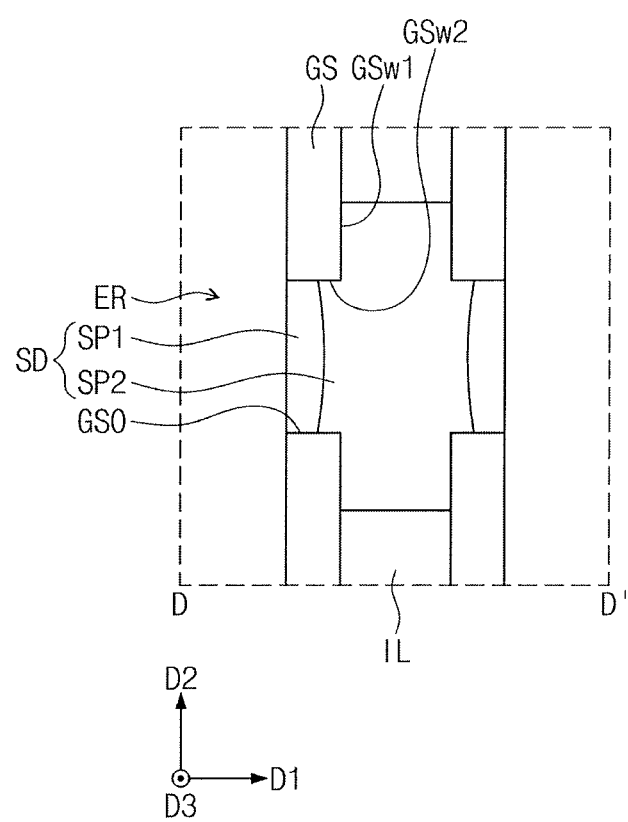

Referring to FIGS. 13A to 13C, an isotropic etching process may be performed to remove the sacrificial layers 103 exposed by the groove GR. Therefore, empty spaces ER may be formed at locations where the sacrificial layers 103 are present. The semiconductor layers 105 constituting the stack structure 150 may be called semiconductor patterns CP. The empty spaces ER may expose the top and bottom surfaces of the semiconductor patterns CP and the top surface of the active pattern AP. The empty spaces ER may also expose an inner sidewall of the first source/drain pattern SP1.

At this stage, a sidewall profile according to the present example embodiment may help reduce or eliminate a process failure. In detail, if the second source/drain pattern SP2 has a germanium content that is the same as or similar to that of the sacrificial layers 103, then the second source/drain pattern SP2 may not have significant etch selectivity with respect to the sacrificial layers 103. In such a case, if the first source/drain pattern SP1 were to have the sidewall profile represented by the dotted line P1 of FIG. 10C, then an etchant that removes the sacrificial layers 103 may migrate through the edge of the spacer opening GSO toward the second source/drain pattern SP2, such that the second source/drain pattern SP2 may all be removed thus increasing the possibility of the occurrence of process failure. However, according to the present example embodiment, because the second-step reflow process causes the first source/drain pattern SP1 to have the sidewall profile represented by the solid line P2 of FIG. 10C and in turn to have a thickness mostly constant at a certain height, or because the second-step reflow process causes the first source/drain pattern SP1 to have a thickness of at least 3 nm at the edge of the spacer opening GSO, an etchant that removes the sacrificial layers 103 may not pass through the first source/drain pattern SP1 at the edge of the spacer opening GSO. Therefore, the second source/drain pattern SP2 may not be removed during the removal of the sacrificial layers 103, and then a process failure may be avoided. As a result, it may be possible to fabricate a semiconductor device with increased yield and reliability.

Subsequently, referring to FIGS. 1 to 3, a deposition process or a thermal oxidation process may be performed to form a gate dielectric layer Gox. The gate dielectric layer Gox may be conformally formed on surfaces of the semiconductor patterns CP, a surface of the active pattern AP, and an inner sidewall of the gate spacer GS. A conductive layer may be deposited to fill the empty spaces ER and the groove GR, and then partially recessed to form a gate electrode GE. A gate capping pattern GP may be formed on the gate electrode GE.

As described above, embodiments relate to a semiconductor device including a gate-all-around type transistor and a method of fabricating the same. Embodiments may provide a semiconductor device having increased reliability. A method of fabricating a semiconductor device may reduce process failure and increase yield.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a channel pattern that includes a first semiconductor pattern and a second semiconductor pattern that are sequentially stacked on a substrate;
   a gate electrode that covers a top surface and a lateral surface of the channel pattern and extends in a first direction, the gate electrode including a first gate segment between the first semiconductor pattern and the second semiconductor pattern;
   a gate spacer that covers a lateral surface of the gate electrode and includes an opening through which the channel pattern is exposed; and
   a first source/drain pattern that is on a side of the gate spacer and is in contact with the channel pattern through the opening, the first source/drain pattern including:
      a sidewall center thickness at a height of the first gate segment and at a center of the opening; and
      a sidewall edge thickness at the height of the first gate segment and at an edge of the opening,
      wherein the sidewall edge thickness is about 0.7 to 1 times the sidewall center thickness.

2. The semiconductor device as claimed in claim 1, further comprising an active pattern that protrudes from the substrate and is below the channel pattern and the first source/drain pattern, wherein:
   the first source/drain pattern extends to contact the active pattern,
   the first source/drain pattern has a bottom thickness at a position where the first source/drain pattern contacts the active pattern, and
   the bottom thickness is greater than the sidewall center thickness.

3. The semiconductor device as claimed in claim 1, wherein the sidewall center thickness increases with decreasing distance from the substrate.

4. The semiconductor device as claimed in claim 1, further comprising a second source/drain pattern that is on the first source/drain pattern and is spaced apart from the channel pattern,
   wherein a portion of the second source/drain pattern is inserted into the opening.

5. The semiconductor device as claimed in claim 4, wherein the first source/drain pattern and the second source/drain pattern each include germanium, a germanium content of the first source/drain pattern being less than a germanium content of the second source/drain pattern.

6. The semiconductor device as claimed in claim 4, further comprising at least one subsidiary source/drain pattern between the first source/drain pattern and the second source/drain pattern, wherein:
   the first source/drain pattern, the second source/drain pattern, and the subsidiary source/drain pattern include germanium, a germanium content of the subsidiary source/drain pattern being greater than a germanium content of the first source/drain pattern and less than a germanium content of the second source/drain pattern.

7. The semiconductor device as claimed in claim 4, wherein the gate spacer includes:

a first spacer sidewall outside the opening; and
a second spacer sidewall that corresponds to an inner sidewall of the opening,
wherein the second source/drain pattern contacts the first and second spacer sidewalls.

8. The semiconductor device as claimed in claim 1, wherein the sidewall edge thickness ranges from 3 nm to 7 nm.

9. The semiconductor device as claimed in claim 1, further comprising a gate dielectric layer interposed between the gate electrode and the gate spacer and exposed by the opening, wherein:
the first source/drain pattern has an outer sidewall spaced apart from the gate dielectric layer,
the gate spacer includes a first sidewall spacer and a second sidewall spacer that are exposed to the opening and that face each other,
the outer sidewall of the first source/drain pattern meets the first sidewall spacer at a first position at the height of the first gate segment,
the outer sidewall of the first source/drain pattern meets the second sidewall spacer at a second position at the height of the first gate segment, and
a first angle between a first tangent line, which is tangent to the outer sidewall of the first source/drain pattern and passes through the first position, and a second tangent line, which is tangent to the outer sidewall of the first source/drain pattern and passes through the second position, ranges from 150° to 180°.

10. A semiconductor device, comprising:
an active pattern that protrudes from a substrate;
a channel pattern that includes a first semiconductor pattern and a second semiconductor pattern that are sequentially stacked on the active pattern;
a gate electrode that covers a top surface and a lateral surface of the channel pattern and extends in a first direction, the gate electrode including a first gate segment between the first semiconductor pattern and the second semiconductor pattern;
a gate spacer that covers a lateral surface of the gate electrode and includes an opening through which a portion of the channel pattern is exposed; and
a first source/drain pattern on a side of the gate spacer, the first source/drain pattern contacting the portion of the channel pattern through the opening and simultaneously contacting the active pattern, the first source/drain pattern including:
a first thickness contacting the portion of the channel pattern through the opening at a side of the opening; and
a second thickness contacting the portion of the channel pattern through the opening in a central region of the opening,
wherein the second thickness is greater than the first thickness.

11. The semiconductor device as claimed in claim 10, wherein a sidewall of the first gate segment has a recessed profile.

12. The semiconductor device as claimed in claim 10, further comprising a second source/drain pattern that is on the first source/drain pattern and is spaced apart from the channel pattern,
wherein a portion of the second source/drain pattern is inserted into the opening.

13. The semiconductor device as claimed in claim 12, wherein the gate spacer includes:
a first spacer sidewall outside the opening; and
a second spacer sidewall that corresponds to an inner sidewall of the opening,
wherein the second source/drain pattern contacts the first and second spacer sidewalls.

14. The semiconductor device as claimed in claim 10, wherein
the second thickness is about 0.7 to 1 times the first thickness.

15. A semiconductor device, comprising:
a channel pattern that includes a first semiconductor pattern and a second semiconductor pattern that are sequentially stacked on a substrate;
a gate electrode that covers a top surface and a lateral surface of the channel pattern and extends in a first direction, the gate electrode including a first gate segment between the first semiconductor pattern and the second semiconductor pattern;
a gate spacer that covers a lateral surface of the gate electrode and includes an opening through which the channel pattern is exposed;
a gate dielectric layer interposed between the first gate segment and the gate spacer and exposed through the opening;
a first source/drain pattern contacting the channel pattern in the opening;
a second source/drain pattern on the first source/drain pattern and having a portion that is in contact with a lateral surface of the gate spacer and is spaced apart from the channel pattern, and has another portion that is inserted into the opening, wherein:
the second source/drain pattern is spaced apart from a sidewall of a gate dielectric layer by a first distance at a height of the first gate segment and at a center of the opening,
the second source/drain pattern is spaced apart from the sidewall of the gate dielectric layer by a second distance at the height of the first gate segment and at an edge of the opening, and
the second distance is about 0.7 to 1 times the first distance.

16. The semiconductor device as claimed in claim 15, wherein a thickness of the first source/drain pattern increases toward the substrate.

17. The semiconductor device as claimed in claim 16, wherein the first source/drain pattern and the second source/drain pattern include germanium, a germanium content of the first source/drain pattern being less than a germanium content of the second source/drain pattern.

18. The semiconductor device as claimed in claim 16, further comprising at least one subsidiary source/drain pattern between the first source/drain pattern and the second source/drain pattern, wherein:
the first source/drain pattern, the second source/drain pattern, and the subsidiary source/drain pattern include germanium, a germanium content of the subsidiary source/drain pattern being greater than a germanium content of the first source/drain pattern and less than a germanium content of the second source/drain pattern.

19. The semiconductor device as claimed in claim 15, wherein the gate spacer includes:
a first spacer sidewall outside the opening; and
a second spacer sidewall that corresponds to an inner sidewall of the opening,
and wherein the second source/drain pattern contacts the first and second spacer sidewalls.

* * * * *